(12) United States Patent
Yanai

(10) Patent No.: US 8,440,474 B2
(45) Date of Patent: May 14, 2013

(54) CHIP QUALITY DETERMINATION METHOD AND MARKING MECHANISM USING SAME

(75) Inventor: Hirokazu Yanai, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 290 days.

(21) Appl. No.: 13/002,795

(22) PCT Filed: Jul. 15, 2009

(86) PCT No.: PCT/JP2009/063144
§ 371 (c)(1),
(2), (4) Date: Jan. 6, 2011

(87) PCT Pub. No.: WO2010/010907
PCT Pub. Date: Jan. 28, 2010

(65) Prior Publication Data
US 2011/0117683 A1  May 19, 2011

(30) Foreign Application Priority Data

Jul. 22, 2008  (JP) .................................. 2008-188687

(51) Int. Cl.
*H01L 21/66* (2006.01)
*G01R 31/26* (2006.01)

(52) U.S. Cl.
USPC .................. 438/14; 438/15; 438/16; 438/17; 702/182; 702/183; 702/185; 257/E21.525

(58) Field of Classification Search .............. 438/14–17; 257/E21.525; 702/182, 183, 185
See application file for complete search history.

(56) References Cited

U.S. PATENT DOCUMENTS

| 5,787,190 | A  | * | 7/1998 | Peng et al. .................... 382/145 |
| 6,393,602 | B1 | * | 5/2002 | Atchison et al. ................ 716/56 |
| 6,507,933 | B1 | * | 1/2003 | Kirsch et al. .................. 382/149 |
| 6,714,885 | B1 | * | 3/2004 | Lee ................................. 702/84 |
| 6,782,297 | B2 | * | 8/2004 | Tabor ............................. 700/55 |
| 6,792,373 | B2 | * | 9/2004 | Tabor ........................... 702/108 |

(Continued)

FOREIGN PATENT DOCUMENTS

| JP | 6-45415 | 2/1994 |
| JP | 2000-269275 | 9/2000 |

(Continued)

OTHER PUBLICATIONS

Written Opinion and International Search Report in PCT/JP2009/063144.

*Primary Examiner* — Thao Le
*Assistant Examiner* — Eric Jones
(74) *Attorney, Agent, or Firm* — Cooper & Dunham LLP

(57) ABSTRACT

A chip quality determination method includes the steps of (a) determining the continuity of defective chips in at least four directions of an X-axis and a Y-axis on a wafer based on the wafer test result of determining the acceptability of chips arranged in a matrix in the four directions on the wafer, and dividing the defective chips into one or more defective groups so that successive ones of the defective chips are in the same defective group; (b) calculating a quality determination index of each of one or more determination target wafer periphery neighboring chips among wafer periphery neighboring chips located within a predetermined range from the periphery of the wafer based on the distance from a corresponding one of the defective groups; and (c) determining the quality of the determination target wafer periphery neighboring chips by comparing the quality determination indexes thereof with a preset threshold.

20 Claims, 18 Drawing Sheets

U.S. PATENT DOCUMENTS

| | | | | |
|---|---|---|---|---|
| 6,895,109 B1* | 5/2005 | Schemmel et al. | 382/149 |
| 7,105,364 B2* | 9/2006 | Suciu et al. | 438/10 |
| 7,167,811 B2* | 1/2007 | Tabor | 702/183 |
| 7,225,107 B2* | 5/2007 | Buxton et al. | 702/183 |
| 7,340,359 B2* | 3/2008 | Erez et al. | 702/81 |
| 7,356,430 B2* | 4/2008 | Miguelanez et al. | 702/108 |
| 7,383,147 B2* | 6/2008 | Dorough et al. | 702/118 |
| 7,386,418 B2* | 6/2008 | Lin et al. | 702/179 |
| 7,390,680 B2* | 6/2008 | Gonzales et al. | 438/14 |
| 7,395,170 B2* | 7/2008 | Scott et al. | 702/118 |
| 7,405,088 B2* | 7/2008 | Matsushita et al. | 438/4 |
| 7,437,271 B2* | 10/2008 | Tabor | 702/183 |
| 7,452,733 B2* | 11/2008 | Suciu et al. | 438/15 |
| 7,528,622 B2* | 5/2009 | Balog et al. | 324/762.02 |
| 7,601,555 B2* | 10/2009 | Kim et al. | 438/48 |
| 7,767,473 B2* | 8/2010 | Suciu et al. | 438/15 |
| 8,000,928 B2* | 8/2011 | Scott et al. | 702/179 |
| 8,041,541 B2* | 10/2011 | Buxton et al. | 702/183 |
| 8,143,076 B2* | 3/2012 | Zimmer et al. | 438/14 |
| 8,161,428 B2* | 4/2012 | Yokogawa | 716/56 |
| 8,190,391 B2* | 5/2012 | Kadosh et al. | 702/118 |
| 2002/0080347 A1 | 6/2002 | Yoda et al. | 356/237.2 |
| 2002/0121915 A1* | 9/2002 | Alonso Montull et al. | 324/765 |
| 2002/0156550 A1* | 10/2002 | Langford | 700/110 |
| 2003/0014205 A1* | 1/2003 | Tabor | 702/84 |
| 2004/0138846 A1* | 7/2004 | Buxton et al. | 702/108 |
| 2004/0267477 A1* | 12/2004 | Scott et al. | 702/108 |
| 2005/0278597 A1* | 12/2005 | Miguelanez et al. | 714/738 |
| 2006/0043998 A1* | 3/2006 | Suciu et al. | 324/765 |
| 2006/0085155 A1* | 4/2006 | Miguelanez et al. | 702/118 |
| 2006/0128039 A1* | 6/2006 | Lin et al. | 438/14 |
| 2006/0226862 A1* | 10/2006 | Suciu et al. | 324/764 |
| 2007/0179743 A1* | 8/2007 | Tabor | 702/182 |
| 2008/0021677 A1* | 1/2008 | Buxton et al. | 702/184 |
| 2008/0189575 A1* | 8/2008 | Miguelanez et al. | 714/25 |
| 2008/0249742 A1* | 10/2008 | Scott et al. | 702/179 |
| 2009/0000995 A1* | 1/2009 | Yanai | 209/557 |
| 2009/0166898 A1* | 7/2009 | Suciu et al. | 257/797 |
| 2009/0265155 A1* | 10/2009 | Yokogawa | 703/14 |
| 2010/0088054 A1* | 4/2010 | Miguelanez et al. | 702/81 |
| 2011/0178967 A1* | 7/2011 | Delp | 706/20 |

FOREIGN PATENT DOCUMENTS

| | | |
|---|---|---|
| JP | 3730106 | 10/2005 |
| JP | 2006-128251 | 5/2006 |
| JP | 3888938 | 12/2006 |
| JP | 2007-335785 | 12/2007 |
| JP | 2009-10303 | 1/2009 |

* cited by examiner

CHIP QUALITY DETERMINATION METHOD AND MARKING MECHANISM USING SAME

TECHNICAL FIELD

The present invention relates generally to chip quality determination methods for determining chip quality on a wafer during the process of manufacturing semiconductor devices (also referred to as "chips") and marking mechanisms using the same, and more particularly to a chip quality determination method for chips located within a predetermined range (area) from the periphery of a wafer, or wafer periphery neighboring chips, and to a marking mechanism using the same.

BACKGROUND ART

Semiconductor devices go through various processes before being completed as products. Various abnormalities during processing in such processes cause a decrease in yield or a decrease in quality. The semiconductor device manufacturing method includes an inking process where the acceptability of chips are determined by conducting an electrical characteristic test (wafer test) on the chips formed on a wafer on a chip-by-chip basis after forming patterns on the wafer in various processes and defective chips are marked with ink. The marking of defective chips depends on the results of the wafer test. It is empirically known, however, that if there is a concentration of defective chips in their distribution (a defective distribution concentration), that is, if defective chips concentrate on part of the wafer, it is impossible to guarantee the quality of chips adjacent to or in the neighborhood of the concentration of defective chips to a sufficient extent even if the adjacent or neighboring chips have been determined as acceptable (not defective) in the wafer test. In particular, if those chips are located at or near the periphery of the wafer, it is more difficult to guarantee their quality.

Therefore, conventionally, wafers having a defective distribution concentration are discarded, thereby guaranteeing the quality of products. The discarding of wafers, however, inevitably causes loss. Further, this loss tends to increase with a recent increase in the size of wafers.

Even if there is a concentration of defective chips in their distribution on a wafer, chips whose quality can be guaranteed to a sufficient extent may be present on the same wafer depending on the distribution of the defective chips. There are various forms of abnormality. For example, there are abnormalities whose effects depend on the separation of chips, such as insufficient exposure in a shot by a stepper in the photolithography process. However, most of the abnormalities such as those due to abnormal discharge in the etching process are independent of the separation of chips. Further, the effects of most of the abnormalities independent of the separation of chips tend to be inversely proportional to the distance from the center of a defective distribution concentration.

In order to save such wafers, the wafer test result is visually confirmed, and acceptable chips adjacent to or in the neighborhood of a defective distribution concentration are regarded as defective chips and marked to be recognized as defective. Hereinafter, the operation of marking chips determined as acceptable in a wafer test but difficult to guarantee in quality, such as acceptable chips adjacent to or in the neighborhood of a defective distribution concentration, in order to recognize such chips as defective is referred to as additional inking.

Additional inking may be carried out by directly inking a wafer or processing a wafer test result. It is common practice to employ the former in the case of using the inker function of a test prober and the latter in the case of performing inking with a prober dedicated to inking (hereinafter, referred to as a marking prober) without using the inker function of the test prober.

According to the method of directly inking the wafer, additional inking is performed on chips that seem to have quality problems while looking at the wafer test result or the inked wafer itself.

According to the method of processing the wafer test result, additional inking is performed on chips that seem to have quality problems while looking at the data of the wafer test displayed on a screen by dedicated software (program).

Further, in these years, inkless methods may be employed that perform processing in a subsequent process based on the electronic information of wafer test results without marking (inking) defective chips. In the case of inkless methods, the operation of changing the electronic information of acceptable chips whose quality is difficult to guarantee to electronic information indicating defective chips in the electronic information of the wafer test result is also referred to as additional inking.

The quality of chips is guaranteed by such operations. However, there is a problem in that selection of potentially defective chips for performing additional inking, which is performed based on experience-based sensory determinations, differs between individuals. Further, selection of potentially defective chips takes a large number of man-hours, which tend to increase with an increase in the size of wafers.

Japanese Patent No. 3888938 proposes an algorithm for solving such problems, which analyzes the distribution of defectives within a wafer and predicts chips that may have problems in quality. This algorithm has improved additional inking.

SUMMARY OF INVENTION

According to one aspect of the present invention, a chip quality determination method includes the steps of (a) determining a continuity of defective chips in at least four directions of an X-axis and a Y-axis on a wafer based on a wafer test result of determining acceptability of chips arranged in a matrix in the four directions on the wafer, and dividing the defective chips into one or more defective groups so that successive ones of the defective chips are in a same defective group; (b) calculating a quality determination index of each of one or more determination target wafer periphery neighboring chips among wafer periphery neighboring chips located within a predetermined range from a periphery of the wafer based on a distance from a corresponding one of the defective groups; and (c) determining a quality of the determination target wafer periphery neighboring chips by comparing the quality determination indexes thereof with a preset threshold.

According to one aspect of the present invention, a computer-readable storage medium stores a program for causing a computer to execute the chip quality determination method as set forth above.

According to one aspect of the present invention, a marking mechanism includes a marking part configured to mark a position on a wafer; and a control part configured to control an operation of the marking part, the control part including a program for causing a computer to execute the chip quality determination method as set forth above, the control part being configured to cause the marking part to operate so as to mark the position on the wafer, the position corresponding to a chip determined as defective by the program.

BRIEF DESCRIPTION OF DRAWINGS

Other objects, features and advantages of the present invention will become more apparent from the following detailed description when read in conjunction with the accompanying drawings, in which.

DESCRIPTION OF EMBODIMENTS

As described above, the algorithm of Japanese Patent No. 3888938 has improved additional inking. However, there are a wide variety of distribution forms of defective chips so that the algorithm of Japanese Patent No. 3888938 alone may not be sufficient to predict all chips to be subjected to additional inking. A description is given of such a case referring to FIG. 1 and FIG. 2.

Figure 1:
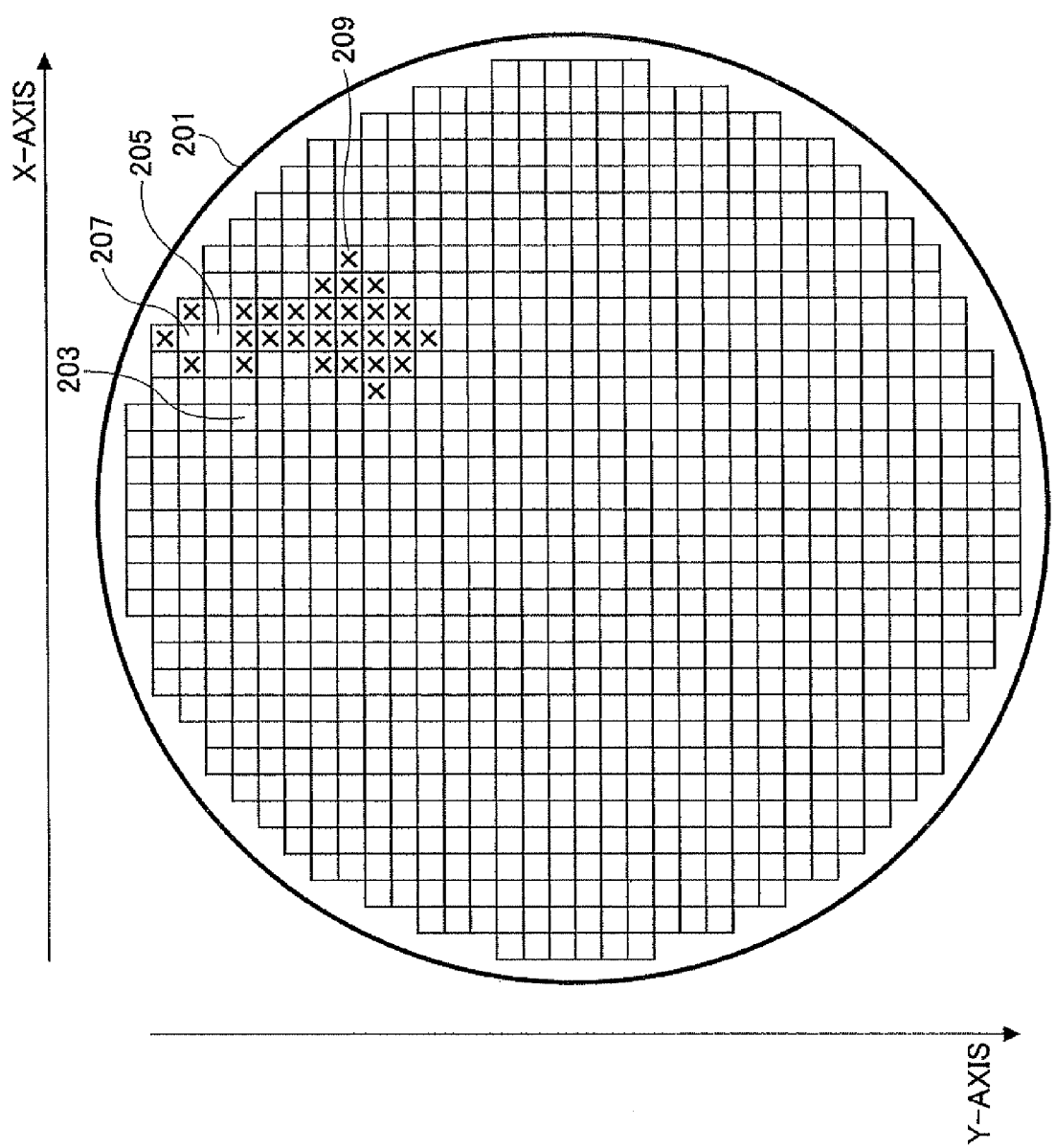
FIG. 1 is a diagram illustrating a final wafer test result of a wafer test process.
Figure 2:
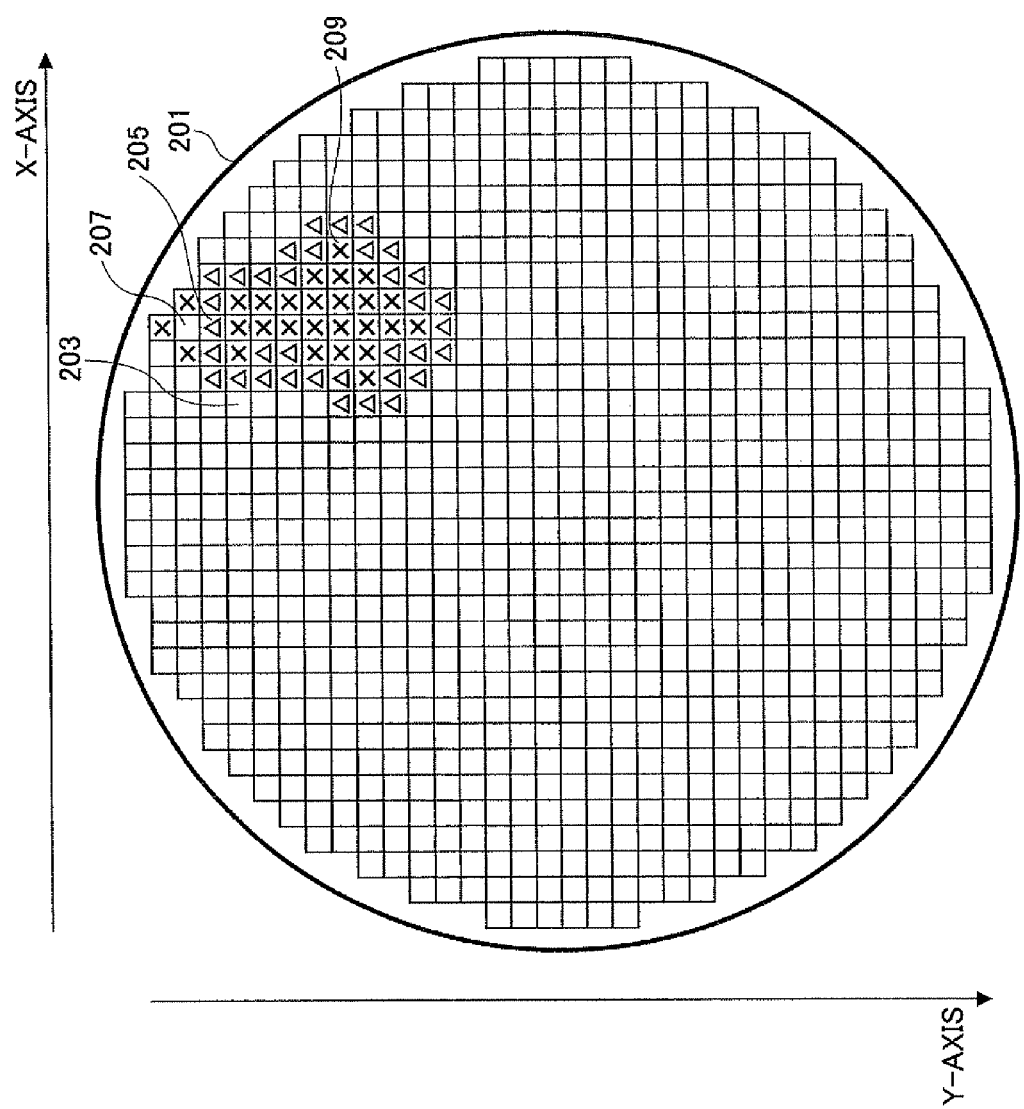
FIG. 2 is a diagram illustrating chips located within a predetermined range from a defective distribution concentration and selected as targets of additional inking by a conventional method of selecting chips to be subjected to additional inking in the wafer test result of FIG. 1.

FIG. 1 illustrates a final wafer test result of a wafer test process. FIG. 2 illustrates chips located within a predetermined range from a defective distribution concentration and selected as targets of additional inking by a conventional method of selecting chips to be subjected to additional inking.

Referring to FIG. 1 and FIG. 2, multiple chips are arranged in a matrix in X-axis and Y-axis directions on a wafer 201.

Referring to FIG. 1, chips determined as (determined to be) acceptable (non-defective) in the wafer test are indicated with no mark like chips 203, 205, and 207, and chips determined as defective are indicated with a cross like a chip 209.

Using the determination of a defective distribution concentration disclosed in Japanese Patent No. 3888938, multiple defective chips including the defective chip 209 illustrated in FIG. 1 may be determined as a single defective distribution concentration. Then, acceptable chips including the chip 205 adjacent to the defective chips belonging to the defective distribution concentration, that is, the acceptable chips within a one-chip range (distance) from the concentrated defective chips, are determined as chips to be subjected to additional inking (indicated with a triangle) as illustrated in FIG. 2.

Referring to FIG. 2, the acceptable chip 207, which is surrounded (on its three sides) by defective chips but is outside the one-chip range from the concentrated defective chips, is not a target of additional inking. Empirically, however, it is highly likely that a chip adjacent to a defective chip near the periphery of a wafer like the acceptable chip 207 has a problem in quality.

In order to automatically determine the acceptable chip 207 adjacent to a defective chip near the periphery of the wafer 201 as a target of additional inking without an operator's intervention, chips within a two-chip range (distance) from the concentrated defective chips may be determined as defective chips.

However, this also determines, for example, the acceptable chip 203, located at a two-chip distance from the defective distribution concentration, as defective. As a result, the acceptable chip 203 is to be subjected to additional inking although it is empirically unlikely that the acceptable chip 203, which is neither near the periphery of the wafer 201 nor adjacent to a defective chip, has a problem in quality.

According to one aspect of the present invention, such a problem may be solved by making determination with respect to chips near the periphery of a wafer in accordance with the possibility of degradation, or the degree of the risk of degradation, in their quality.

According to one aspect of the present invention, a chip quality determination method and a marking mechanism are provided that, with respect to a wafer having multiple chips arranged thereon in a matrix in X-axis and Y-axis directions, can determine the quality of chips near the periphery of the wafer with accuracy while guaranteeing their quality.

A description is given below of an embodiment of the present invention.

According to a chip quality determination method of this embodiment, a concentration of defective chips in their distribution (a defective distribution concentration) is detected by verifying or determining the continuity of defective chips based on a wafer test result, and the effect of the defective distribution concentration over chips near the periphery of the wafer is thereafter converted into indexes.

Figure 3:
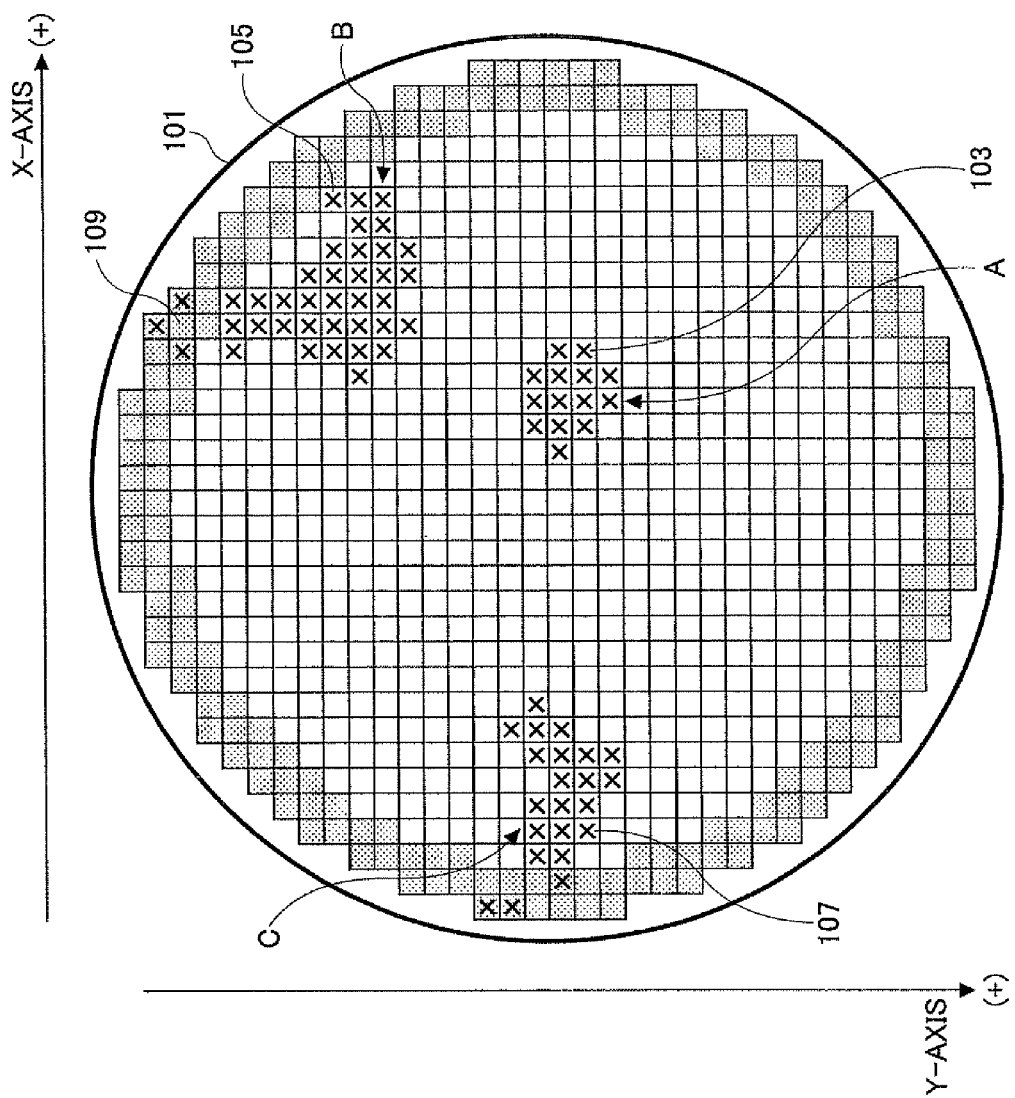
FIG. 3 is a diagram illustrating a final wafer test result of a wafer test process according to an embodiment of the present invention.

FIG. 3 illustrates a final wafer test result of a wafer test process.

Multiple chips are arranged in a matrix in X-axis and Y axis directions on a wafer 101. Referring to FIG. 3, chips determined as acceptable (non-defective) in the wafer test are indicated with no mark like a chip 109, and chips determined as defective are indicated with a cross like chips 103, 105, and 107.

Figure 4:
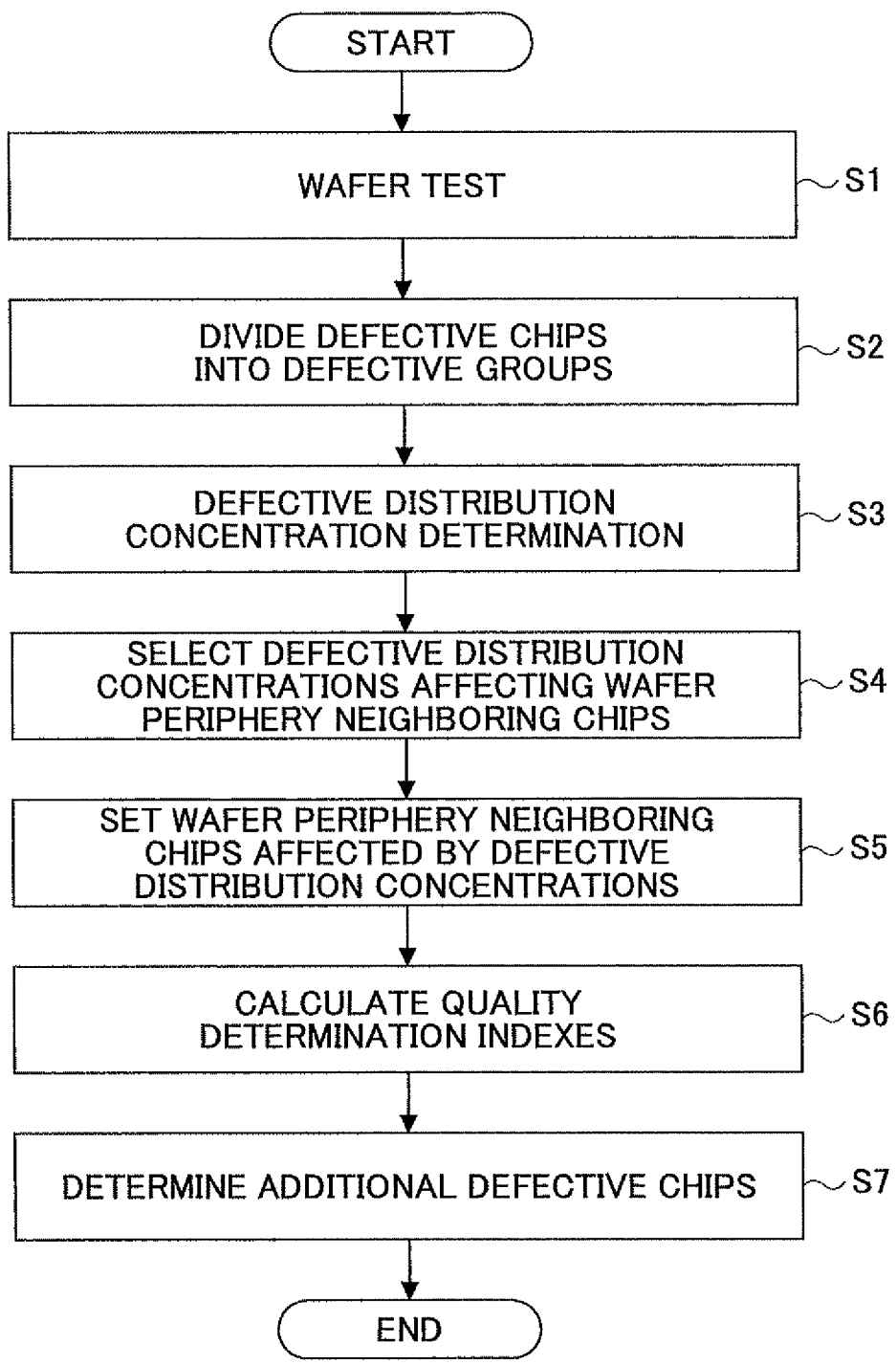
FIG. 4 is a flowchart for illustrating a chip quality determination method according to the embodiment of the present invention.

FIG. 4 is a flowchart for illustrating a chip quality determination method according to this embodiment. FIG. 5, FIG. 6, FIG. 7, and FIG. 8 are enlarged views of defective distribution concentrations and their neighborhood according to this embodiment. A description is given, with reference to FIG. 3 through FIG. 8, of the chip quality determination method according to this embodiment.

Referring to FIG. 4, in step S1, a wafer test is conducted to determine whether chips arranged in a matrix in X-axis and Y-axis directions on the wafer 101 are acceptable, that is, to discriminate between acceptable (non-defective) chips and defective chips on the wafer 101. This step may be referred to as a wafer test step.

In step S2, the continuity of defective chips in eight directions, that is, the four X-axis and Y-axis directions (the four directions along the X-axis and Y-axis) plus four directions at a rotational angle of 45 degrees to the four X-axis and Y-axis directions about their center, is determined based on the result of the wafer test of step S1, and defective chips are divided into defective groups so that continuous (successive) defective chips belong to the same group. This step may be referred to as a defective chip grouping step. In the wafer test result illustrated in FIG. 3, there are five defective groups, that is, five groups of defective chips. If the defective chips are grouped based on the continuity of defective chips in the four X-axis and Y-axis directions in the wafer test result illustrated in FIG. 3, the defective chips are divided into seven defective groups.

In step S3, with respect to each defective group, the number of defective chips belonging to the defective group is compared with a preset threshold for the number of defective chips. If the number of defective chips is more than or equal to the threshold, the defective group is determined as a concentration of defective chips in their distribution (a defective distribution concentration). This step may be referred to as a defective distribution concentration determination step.

Here, by way of example, it is assumed that the threshold is ten. In this case, in the wafer test result illustrated in FIG. 3, a defective group including the defective chip 103, a defective group including the defective chip 105, and a defective group including the defective chip 107 are determined as defective distribution concentrations. This defective distribution concentration determination step of step S3 is performed to exclude a small defective group that does not affect the quality of surrounding chips from targets of processing.

In step S4, it is determined whether the defective group determined as a defective distribution concentration in step S3 affects wafer periphery neighboring chips, or chips near (in the neighborhood of) the periphery of the wafer 101. This step may be referred to as a defective distribution concentration selecting step or a defective group selecting step. For convenience of description, the defective group including the defective chip 103, the defective group including the defective chip 105, and the defective group including the defective chip 107 in FIG. 3 are referred to as Defective Distribution Concentration A, Defective Distribution Concentration B, and Defective Distribution Concentration C, respectively.

Here, a region located at the periphery of a wafer where the quality (of chips) is susceptible to foreign matter in the semiconductor manufacturing process is referred to as "wafer periphery neighboring region." Empirically, this region may be defined as a region within a certain distance from the periphery of the wafer. Wafer periphery neighboring chips refer to chips in the wafer periphery neighboring region. In FIG. 3, chips in the region indicated by two chips' worth of dot patterns are wafer periphery neighboring chips.

Besides being defined as a region within a certain distance from the wafer periphery, the wafer periphery neighboring region may also be defined in advance in correlation with layout information as chip information. In the case of defining the wafer periphery neighboring region as chip information, for example, the distance from the wafer periphery may differ between the orientation flat part and other parts of the wafer.

The effect of a defective distribution concentration depends on the distance from a chip to be subjected to determination (as to whether the defective distribution concentration affects the chip). Therefore, if the distance from a wafer periphery neighboring chip to be subjected to determination is within a predetermined range, it may be determined that the defective distribution concentration affects the wafer periphery neighboring chip. In this embodiment, if a defective distribution concentration includes a defective chip that is in contact with a wafer periphery neighboring chip in the defective distribution concentration selecting step of step S4, it is determined that the defective distribution concentration affects the wafer periphery neighboring chip. Therefore, Defective Distribution Concentration A is determined as not affecting a wafer periphery neighboring chip, and is not to be subjected to subsequent processing. On the other hand, Defective Distribution Concentrations B and C are determined as affecting a wafer periphery neighboring chip, and are to be subjected to subsequent processing. The defective distribution concentration selecting step of step S4 is performed to exclude a defective distribution concentration at such a position as to not affect the quality of surrounding (neighboring) chips from targets of processing.

Instead of the above-described method of selecting a defective distribution concentration that affects a wafer periphery neighboring chip, a method may be employed that selects a defective distribution concentration including a defective chip located within a predetermined range (distance) from the periphery of a wafer or selects a defective distribution concentration including a defective wafer periphery neighboring chip.

In step S5, a wafer periphery neighboring chip, for which the effect of the defective distribution concentration determined as affecting a wafer periphery neighboring chip is to be determined, is set (determined) as a determination target wafer periphery neighboring chip. This step may be referred to as a determination target setting step. According to this embodiment, if a defective chip belonging to a defective distribution concentration and not being a wafer periphery neighboring chip is in contact with a wafer periphery neighboring chip in one direction, or on one side of the defective chip, the wafer periphery neighboring chip and any other wafer periphery neighboring chips in the one direction from the defective chip are determined as determination target wafer periphery neighboring chips. If the defective chip is in contact with wafer periphery neighboring chips in two directions, or on two sides of the defective chip, the wafer periphery neighboring chips, any other wafer periphery neighboring chips in the two directions from the defective chip, and any other wafer periphery neighboring chips between the two directions are determined as determination target wafer periphery neighboring chips.

This is described below in relation to Defective Distribution Concentration B using FIG. 5. The defective chips that belong to Defective Distribution Concentration B, are not wafer periphery neighboring chips, and are in contact with a wafer periphery neighboring chip are the defective chip 105, a defective chip 111, and a defective chip 113.

The defective chip 105 is in contact with wafer periphery neighboring chips on its two sides. Therefore, the two wafer periphery neighboring chips in the plus (+) direction of the X-axis from the defective chip 105, the three wafer periphery neighboring chips in the minus (−) direction of the Y-axis from the defective chip 105, and the three wafer periphery neighboring chips defined (isolated) by the L-letter formed by these five chips and the defective chip 105 are determined as determination target wafer periphery neighboring chips.

The defective chip 111 is in contact with a wafer periphery neighboring chip on its one side. Therefore, the three wafer periphery neighboring chips in the minus (−) direction of the Y-axis from the defective chip 111 are determined as determination target wafer periphery neighboring chips.

The defective chip 113 is in contact with wafer periphery neighboring chips on its two sides. Therefore, the three wafer periphery neighboring chips in the plus (+) direction of the X-axis from the defective chip 113, the two wafer periphery neighboring chips in the minus (−) direction of the Y-axis from the defective chip 113, and the two wafer periphery neighboring chips defined by the L-letter formed by these five chips and the defective chip 113 are determined as determination target wafer periphery neighboring chips.

Figure 5:
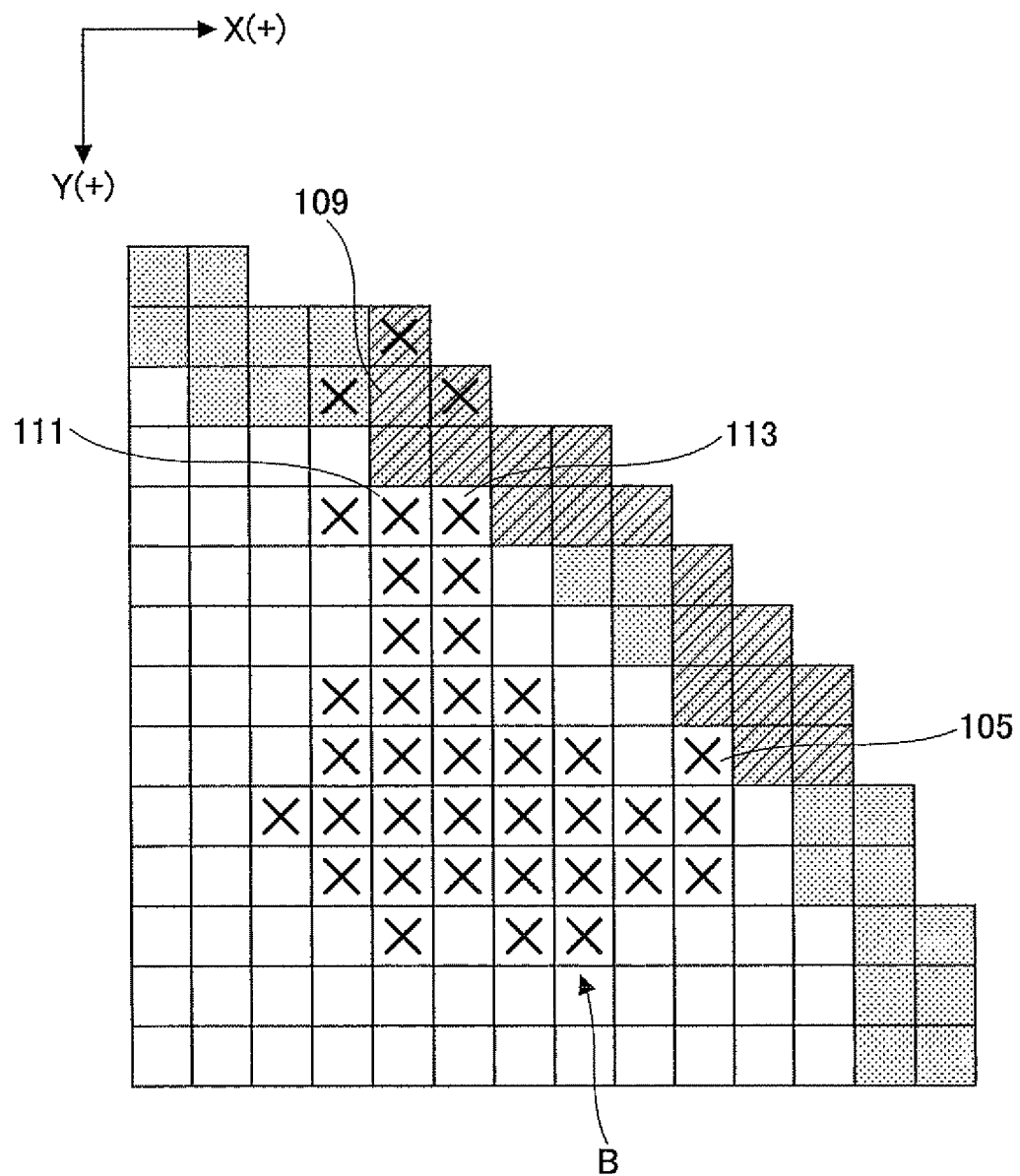
FIG. 5 is an enlarged view of Defective Distribution Concentration B and its neighborhood in the wafer test result illustrated in FIG. 3, showing determination target wafer periphery neighboring chips by hatching according to the embodiment of the present invention.

In FIG. 5, the determination target wafer periphery neighboring chips are indicated by hatching. The region indicated by hatching (hatched region) is a region for which the effect of Defective Distribution Concentration B is determined or measured in the wafer periphery neighboring region.

Figure 6:
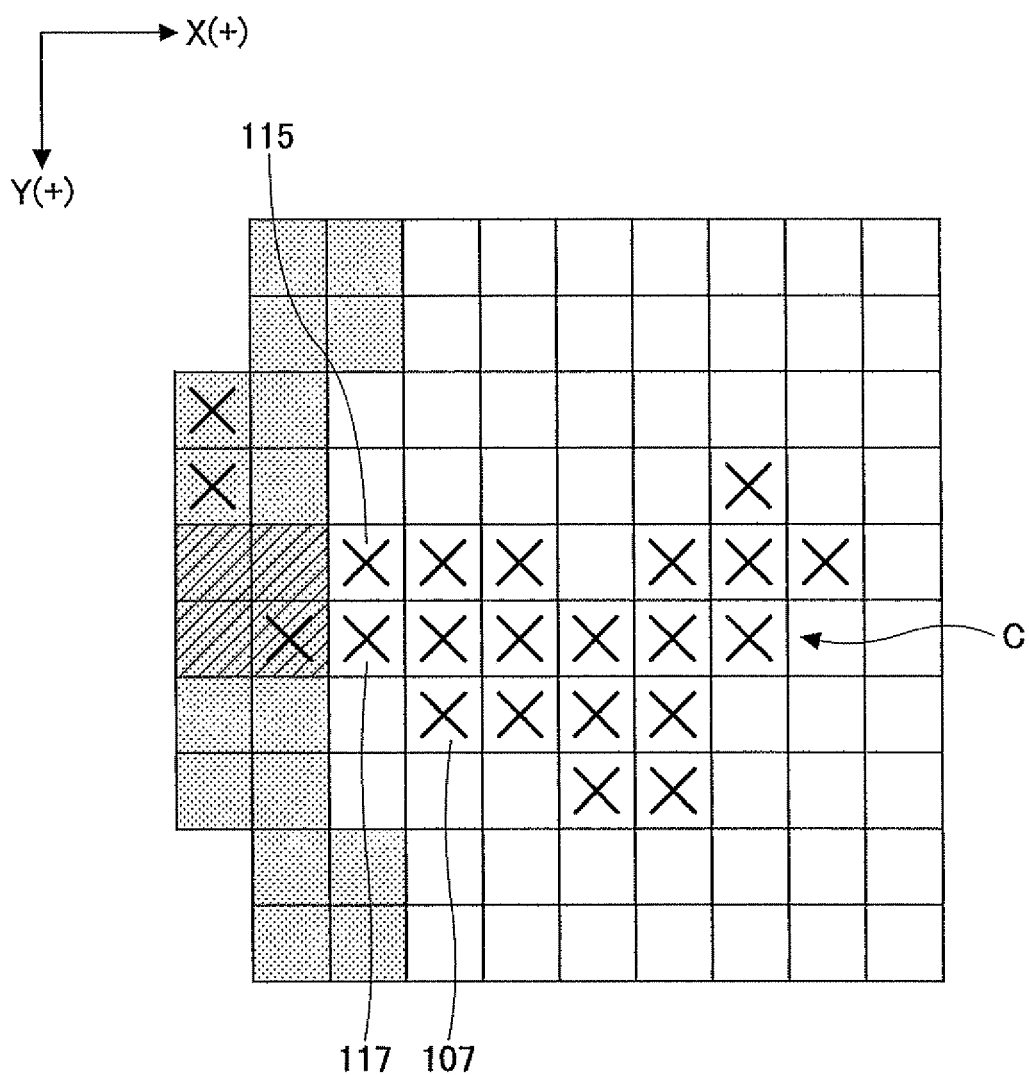
FIG. 6 is an enlarged view of Defective Distribution Concentration C and its neighborhood in the wafer test result illustrated in FIG. 3, showing determination target wafer periphery neighboring chips by hatching according to the embodiment of the present invention.

Further, a description is given of Defective Distribution Concentration C using FIG. 6. The defective chips that belong to Defective Distribution Concentration C, are not wafer periphery neighboring chips, and are in contact with a wafer periphery neighboring chip are a defective chip 115 and a defective chip 117. Each of the defective chips 115 and 117 is in contact with a wafer periphery neighboring chip on its one side. Therefore, four wafer periphery neighboring chips in total, two each in the minus (−) direction of the X-axis, are determined as determination target wafer periphery neighboring chips.

In FIG. 6, the determination target wafer periphery neighboring chips are indicated by hatching. The hatched region is a region for which the effect of Defective Distribution Concentration C is determined or measured in the wafer periphery neighboring region.

The determination target setting step of step S5 is performed to exclude, from targets of processing, wafer periphery neighboring chips for which the effect of the defective distribution concentration selected in step S4 over chip quality does not have to be determined or measured.

There are various other methods for setting (determining) a determination target wafer periphery neighboring chip.

For example, if a defective chip belonging to a defective distribution concentration and not being a wafer periphery neighboring chip is in contact with a wafer periphery neighboring chip in a direction, or on a side of the defective chip, the wafer periphery neighboring chip and any other wafer periphery neighboring chips in the direction from the defective chip and any other wafer periphery neighboring chips in directions inclined at 45 degrees to the direction may be set (determined) as determination target wafer periphery neighboring chips. Alternatively, wafer periphery neighboring chips within a predetermined range (distance) from a defective chip belonging to a defective distribution concentration, for example, wafer periphery neighboring chips within the range of two chips from a defective chip belonging to a defective distribution concentration, may be set (determined) as determination target wafer periphery neighboring chips.

In step S6, the indexes of the effect of the defective distribution concentration over the determination target wafer periphery neighboring chips set in step S5 are determined on a chip-by-chip basis. This step may be referred to as a determination target wafer periphery neighboring chip quality determination index calculation step.

Figure 7:
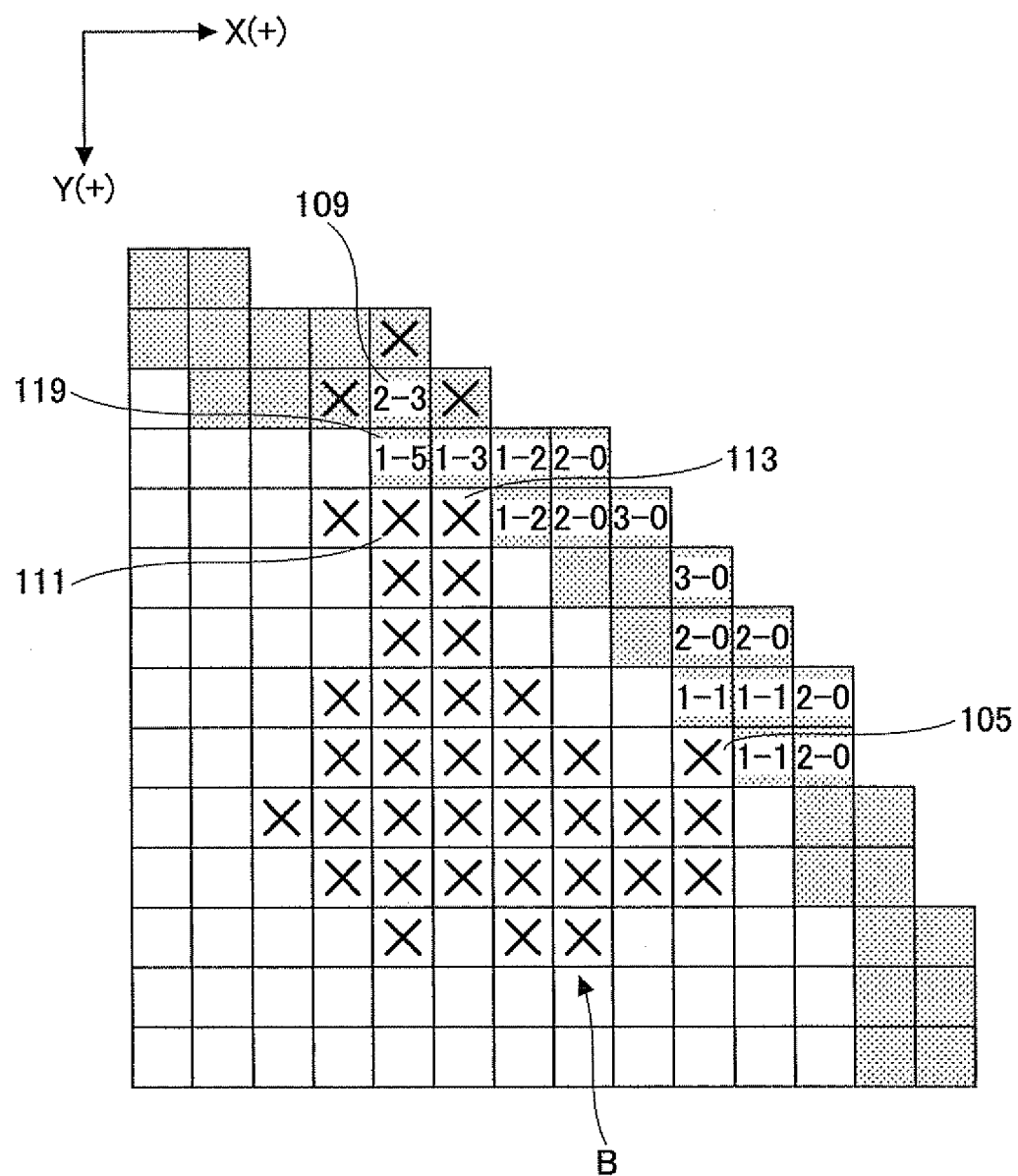
FIG. 7 is an enlarged view of Defective Distribution Concentration B and its neighborhood in the wafer test result illustrated in FIG. 3, showing the quality determination indexes of the determination target wafer periphery neighboring chips according to the embodiment of the present invention.
Figure 8:
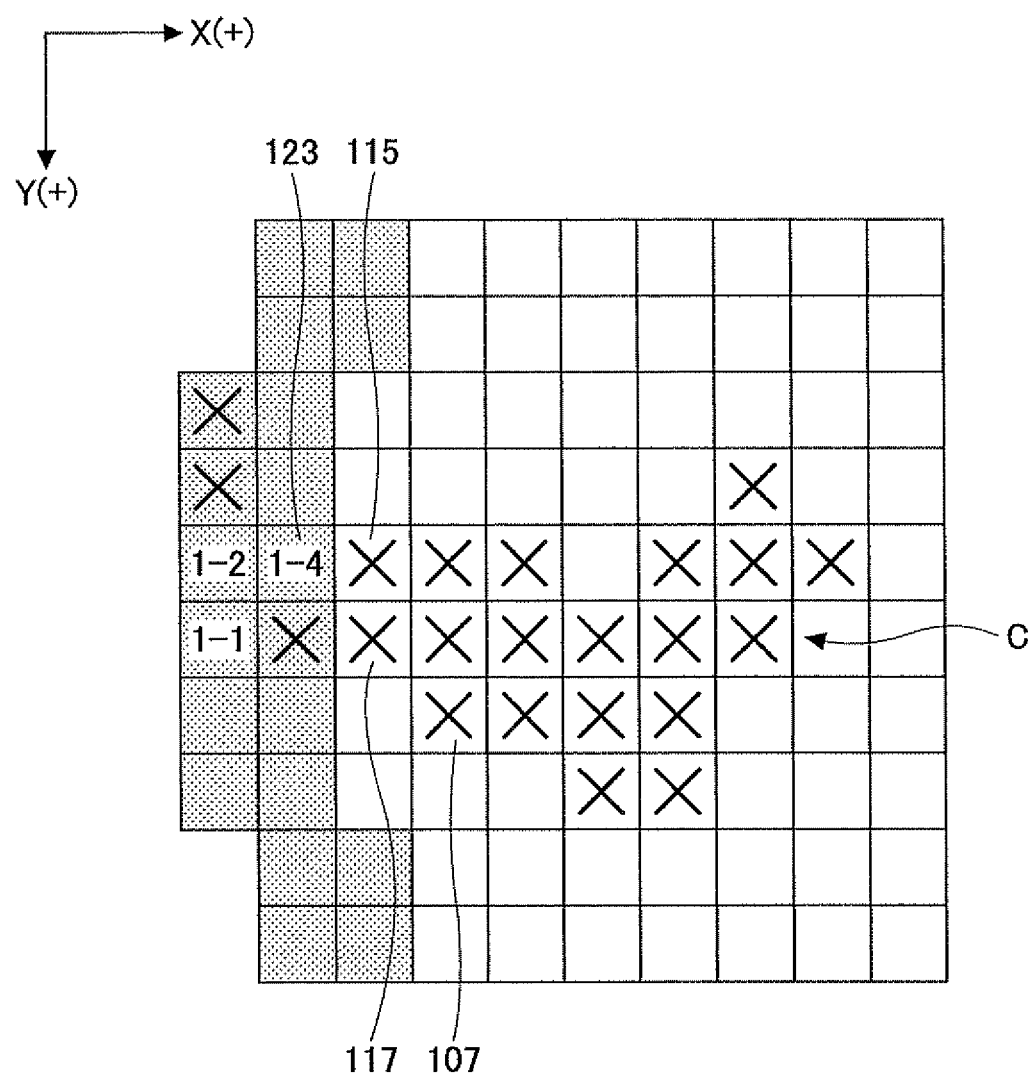
FIG. 8 is an enlarged view of Defective Distribution Concentration C and its neighborhood in the wafer test result illustrated in FIG. 3, showing the quality determination indexes of the determination target wafer periphery neighboring chips according to the embodiment of the present invention.

According to this embodiment, the distance (from the determination target wafer periphery neighboring chip) to the defective distribution concentration, that is, the number of chips up to the defective distribution concentration, is determined as a first quality determination index, and the number of defective chips in the eight chips surrounding the determination target wafer periphery neighboring chip is determined as a second quality determination index. FIG. 7 illustrates the quality determination indexes of the determination target wafer periphery neighboring chip with respect to Defective Distribution Concentration B. FIG. 8 illustrates the quality determination indexes of the determination target wafer periphery neighboring chip with respect to Defective Distribution Concentration C. In FIG. 7 and FIG. 8, in each determination target wafer periphery neighboring chip, a number on the left indicates the first quality determination index and a number on the right indicates the second quality determination index.

In determining the distance, that is, the number of chips, between the determination target wafer periphery neighboring chip and the defective distribution concentration as the first quality determination index, the distance is calculated using one chip as a unit also for a diagonal direction. Alternatively, however, the first quality determination index may be determined by weighting the distance by, for example, using 1.5 chips as a unit of calculation in the case of a diagonal direction. Further, the distance may be calculated (determined) based on the metric system in place of the number of chips.

The number of defective chips in the eight chips surrounding the determination target wafer periphery neighboring chip is determined as the second quality determination index. Alternatively, the number of defective chips within a predetermined range (distance) from the determination target wafer periphery neighboring chip, for example, the number of defective chips within the 24 chips surrounding the determination target wafer periphery neighboring chip, may be determined as the second quality determination index. Further, the second quality determination index may be determined by weighting a defective chip based on its positional relationship with the determination target wafer periphery neighboring chip. For example, a defective chip in a diagonal direction from the determination target wafer periphery neighboring chip may be weighted in counting the number of defective chips.

In step S5 or step S6, of the wafer periphery neighboring chips determined as determination target wafer periphery neighboring chips, those determined as defective in the wafer test of step S1 may be excluded from the determination target wafer periphery neighboring chips.

In step S7, the quality of the determination target wafer periphery neighboring chips is determined on a chip-by-chip basis by comparing their determined indexes with preset thresholds. This step may be referred to as a quality determination step.

By way of example, the threshold of the first quality determination index is set (determined) as two (within two chips), and the threshold of the second quality determination index is set (determined) as three (three or more chips). In this case, the wafer periphery neighboring chip 109 (FIG. 7), wafer periphery neighboring chips 119 and 121 (FIG. 7), and a wafer periphery neighboring chip 123 (FIG. 8), which have been determined as acceptable in the wafer test, are determined as additional defective chips. Here, additional defective chips refer to defective chips that are added to the wafer test result by the chip quality determination method of this embodiment. Thus, the chip 109, which cannot be determined as a target of additional inking by the method of Japanese Patent No. 3888938 that determines a chip within a one-chip range (distance) from a defective distribution concentration, may be determined as an additional defective chip.

The processing of step S1 through step S7 is one embodiment of the present invention, and the present invention may be implemented in various forms.

For example, in setting (determining) a wafer periphery neighboring chip within a predetermined range (distance) from a defective chip belonging to a defective distribution concentration as a determination target wafer periphery neighboring chip in the determination target setting step of step S5, the predetermined range may be set equal to a range corresponding to the threshold of the first quality determination index used in the quality determination step of step S7. In this case, calculation of the first quality determination index may be omitted in the quality determination index calculation step of step S6, and the same determination result as in the above-described embodiment may be produced by comparing the second quality determination index with its threshold in the quality determination step of step S7.

By way of example, a description is given of the case where the value of the predetermined range in the determination target setting step of step S5 is two (within a two-chip range) and the threshold of the second quality determination index is three (three or more chips). In this case, a wafer periphery neighboring chip within a two-chip range from a defective chip belonging to a defective distribution concentration is a determination target wafer periphery neighboring chip. In the quality determination index calculation step of step S6, the number of defective chips within the eight chips surrounding the determination target wafer periphery neighboring chip is calculated (determined) as the second quality determination index.

Figure 9:
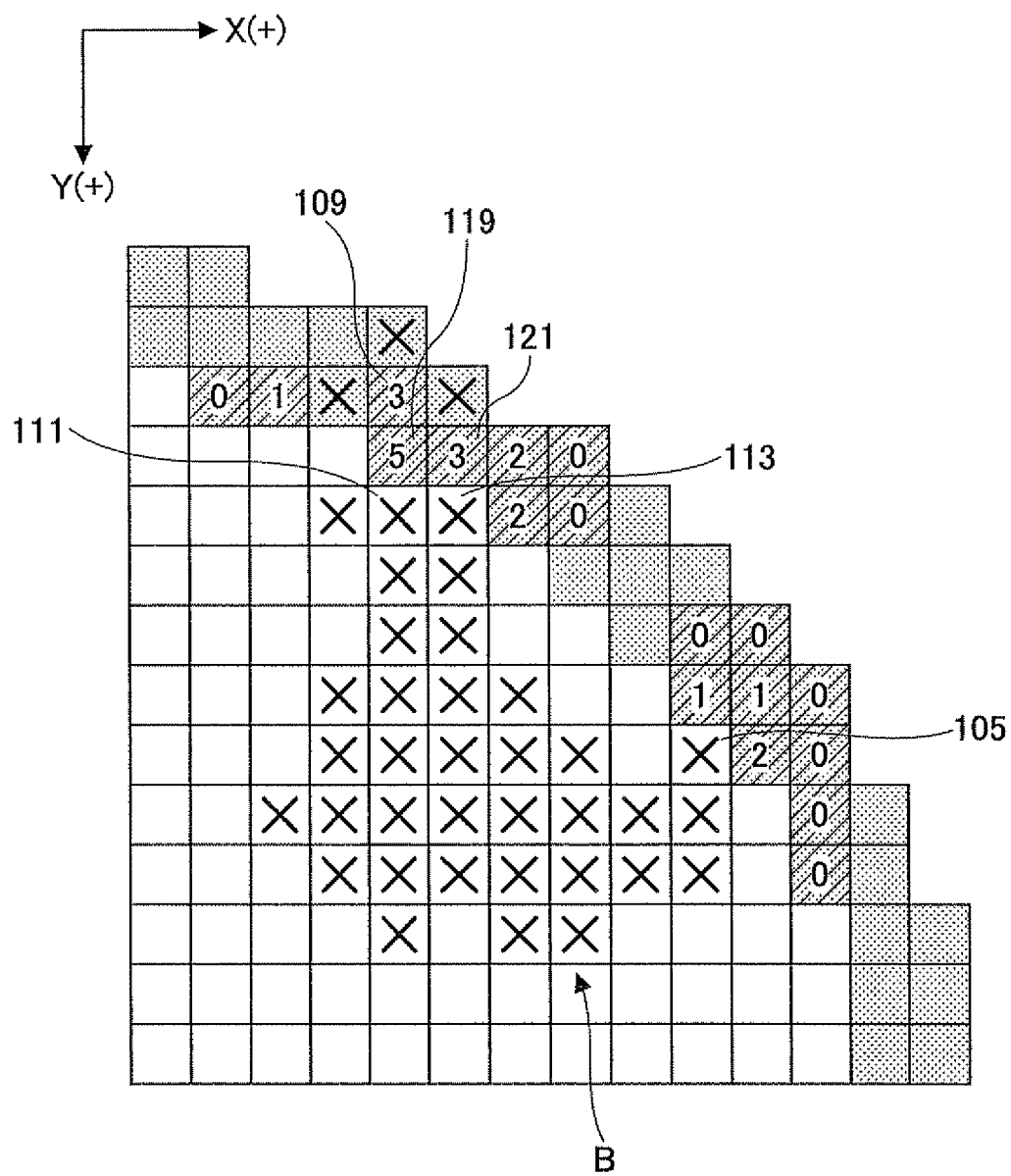
FIG. 9 is an enlarged view of Defective Distribution Concentration B and its neighborhood in the wafer test result illustrated in FIG. 3, showing the quality determination indexes of determination target wafer periphery neighboring chips calculated by another method according to the embodiment of the present invention.
Figure 10:
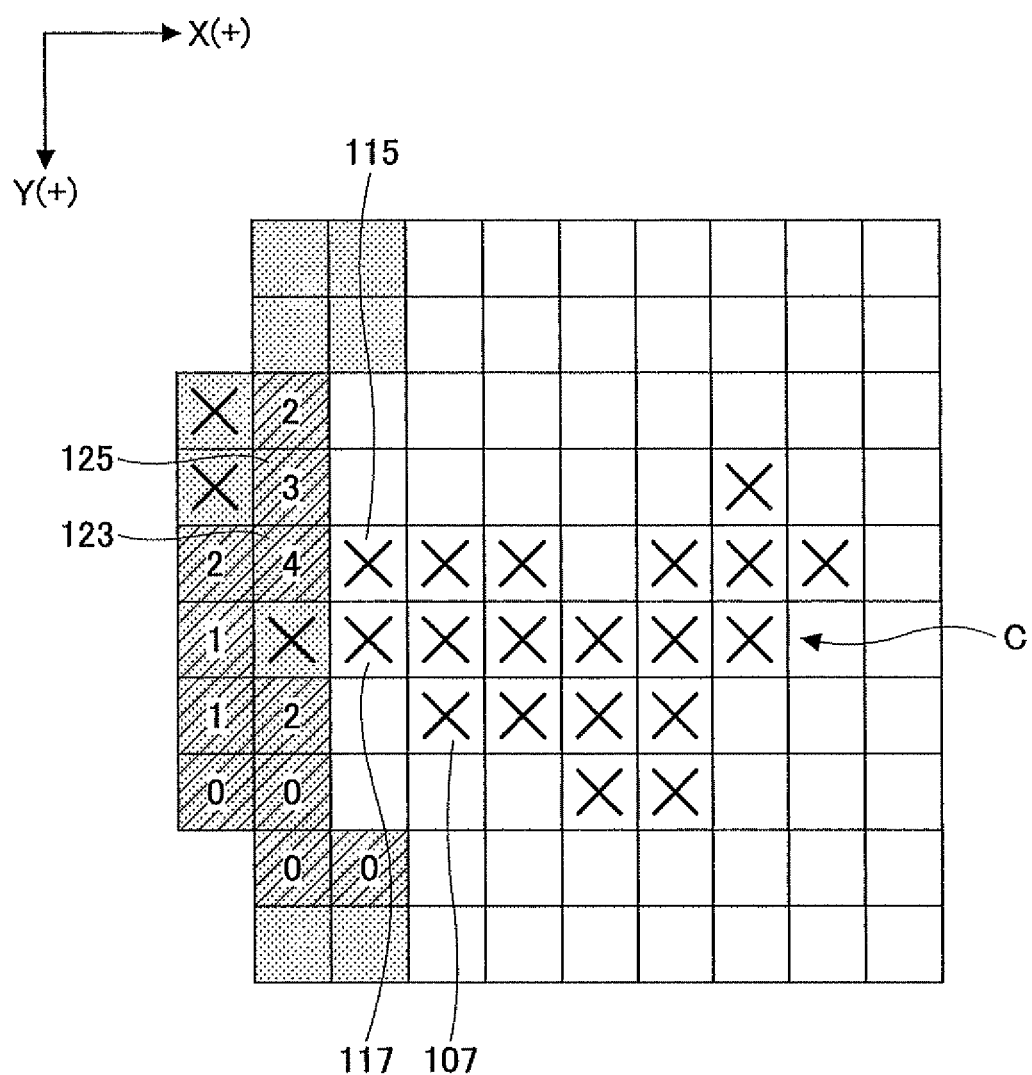
FIG. 10 is an enlarged view of Defective Distribution Concentration C and its neighborhood in the wafer test result illustrated in FIG. 3, showing the quality determination indexes of determination target wafer periphery neighboring chips calculated by another method according to the embodiment of the present invention.

FIG. 9 illustrates the second quality determination indexes of determination target wafer periphery neighboring chips for Defective Distribution Concentration B illustrated in FIG. 3 in this case. FIG. 10 illustrates the second quality determination indexes of determination target wafer periphery neighboring chips for Defective Distribution Concentration C illustrated in FIG. 3 in this case. In FIG. 9 and FIG. 10, the determination target wafer periphery neighboring chips are indicated by hatching. Further, the numbers of the hatched determination target wafer periphery neighboring chips indicate their second quality determination indexes.

The threshold of the second quality determination index in the quality determination step of step S7 is three (three or more chips). Thus, the wafer periphery neighboring chips 109, 119, and 121 (FIG. 9), the wafer periphery neighboring chip 123 (FIG. 10), and a wafer periphery neighboring chip 125 (FIG. 10), which have been determined as acceptable in the wafer test, are determined as additional defective chips. Thus, the chip 109, which cannot be determined as a target of additional inking by the method of Japanese Patent No. 3888938 that determines a chip within a one-chip range (distance) from a defective distribution concentration, may be determined as an additional defective chip.

Compared with the determined result described above with reference to FIG. 5 through FIG. 8, the wafer periphery neighboring chip 125 is added to the additional defective chips because of a difference in determination target wafer periphery neighboring chips. However, the wafer periphery neighboring chip 125 would also be determined as an additional defective chip by the method of Japanese Patent No. 3888938 that determines a chip within a one-chip range (distance) from a defective distribution concentration. Therefore, the determination illustrated in FIG. 9 and FIG. 10 is not excessive in an overall evaluation.

Further, the defective distribution concentration determination step of step S3 may be omitted. In this case, the same processing as described above may be performed on each of the defective groups determined in step S2 in place of defective distribution concentrations.

Figure 11:
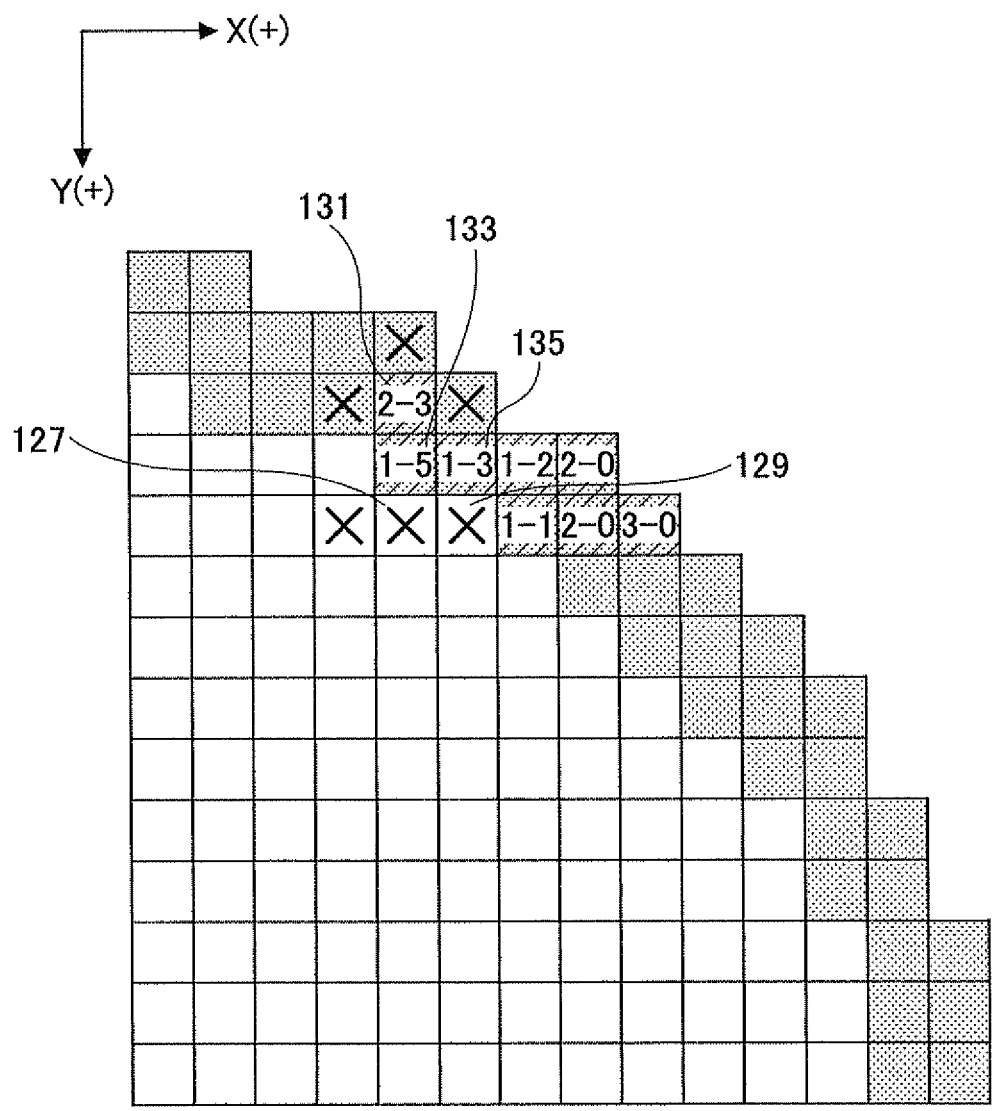
FIG. 11 is a diagram illustrating another wafer test result, showing the quality determination indexes of determination target wafer periphery neighboring chips calculated by yet another method according to the embodiment of the present invention.

For example, in the case illustrated in FIG. 11, the processing in and after step S4 is to be performed on a small defective group of three defective chips including defective chips 127 and 129.

In FIG. 11, determination target wafer periphery neighboring chips are indicated by hatching. In each determination target wafer periphery neighboring chip, a number on the left indicates the first quality determination index and a number on the right indicates the second quality determination index. If the threshold of the first quality determination index is two (within a two-chip range), and the threshold of the second quality determination index is three (three or more chips), wafer periphery neighboring chips 131, 133, and 135 that are determined as acceptable in a wafer test may be determined as additional defective chips.

Further, the defective distribution concentration selection step of step S4 may be omitted. In this case, the same processing as described above may be performed on each defective distribution concentration or each defective group.

This is also described with reference to the wafer test result illustrated in FIG. 3. Referring to FIG. 3, the processing in and after step S5 is to be performed also on Defective Distribution Concentration A. According to this embodiment, there are three kinds of determination target setting steps. According to these determination target setting steps, if a wafer periphery neighboring chip is in contact with or within a predetermined range of a defective chip of a defective group (or defective distribution concentration), the wafer periphery neighboring chip is determined as a determination target wafer periphery neighboring chip. If the determination target setting step employs the former condition, no determination target wafer periphery neighboring chip is set (determined) for Defective Distribution Concentration A illustrated in FIG. 3 because no wafer periphery neighboring chip is in contact with Defective Distribution Concentration A. On the other hand, if the determination target setting step employs the latter condition, it does not make much sense to enlarge the predetermined range from a defective chip of a defective group because a chip at a distant position from the defective group has its quality hardly affected by the defective group. Accordingly, no determination target wafer periphery neighboring chip is set (determined) for Defective Distribution Concentration A, which is ten chips or more away from the wafer periphery neighboring region. Accordingly, the determination result for the wafer test result illustrated in FIG. 3 is the same as in the case of performing the defective distribution concentration selection step of step S4.

Further, the determination target setting step of step S5 may also be omitted. In this case, all wafer periphery neighboring chips are subjected to determination. A description is given below of an example of this case.

Figure 12:
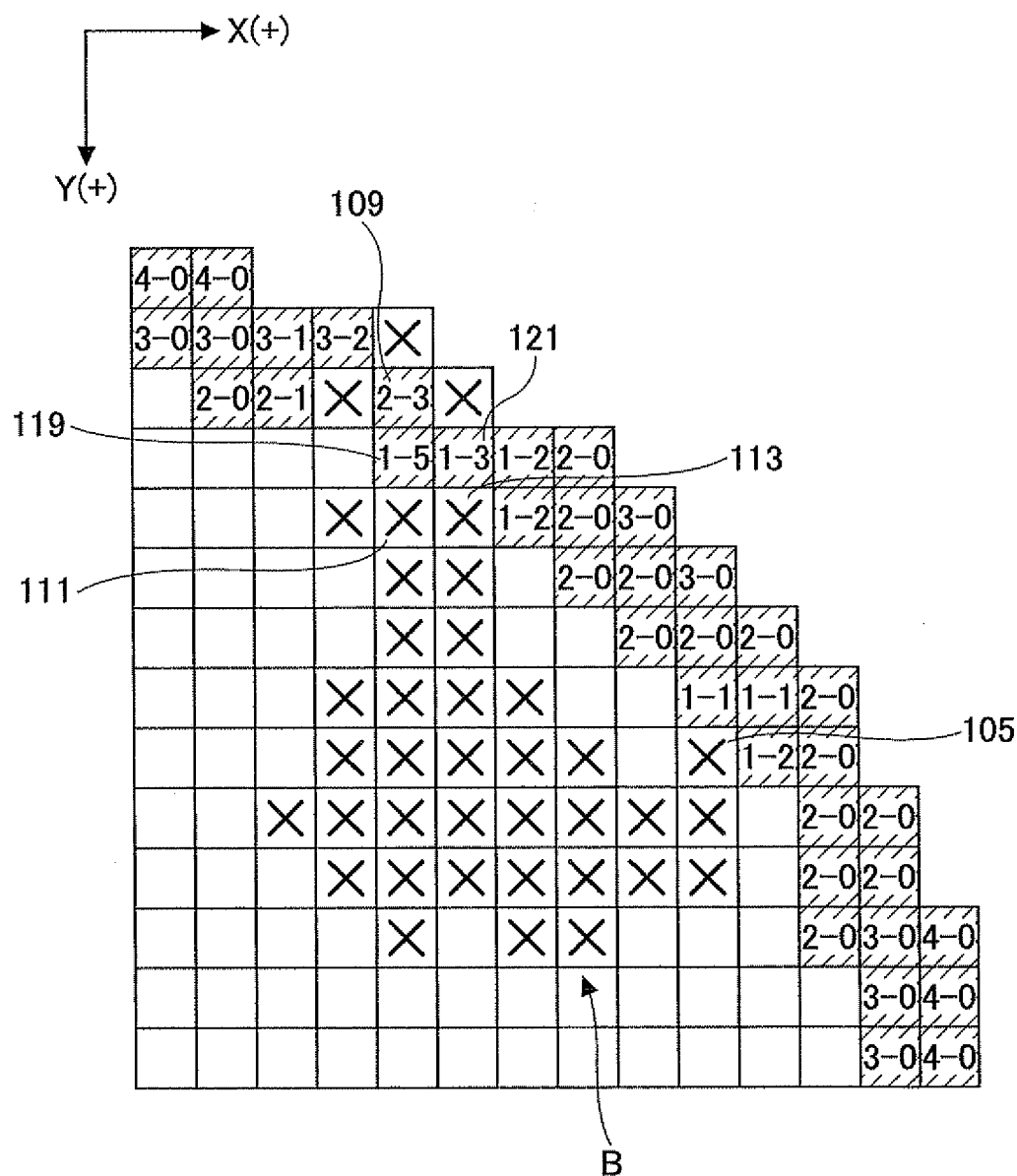
FIG. 12 is an enlarged view of Defective Distribution Concentration B and its neighborhood in the wafer test result illustrated in FIG. 3, showing the quality determination indexes of determination target wafer periphery neighboring chips calculated by yet another method according to the embodiment of the present invention.

With respect to each wafer periphery neighboring chip, the distance to Defective Distribution Concentration B, that is, the number of chips up to Defective Distribution Concentration B, is determined as the first quality determination index, and the number of defective chips within the eight chips surrounding the wafer periphery neighboring chip is determined as the second quality determination index. FIG. 12 illustrates part of the determination results. In FIG. 12, in each wafer periphery neighboring chip, a number on the left indicates the first quality determination index and a number on the right indicates the second quality determination index. If the threshold of the first quality determination index is two (within a two-chip range), and the threshold of the second quality determination index is three (three or more chips), the wafer periphery neighboring chips 109, 119, and 121 that have been determined as acceptable in the wafer test are determined as additional defective chips. The wafer periphery neighboring chips outside the region illustrated in FIG. 12, whose first quality determination indexes with respect to Defective Distribution Concentration B are four or more, are not determined as additional defective chips.

Thus, the result is the same as in the case of performing the determination target setting step of step S5.

Further, the second quality determination index may not be calculated in the quality determination index calculation step of step S6. In this case, the quality of the determination target wafer periphery neighboring chip may be determined based only on the first quality determination index in the quality determination step of step S7.

Figure 13:
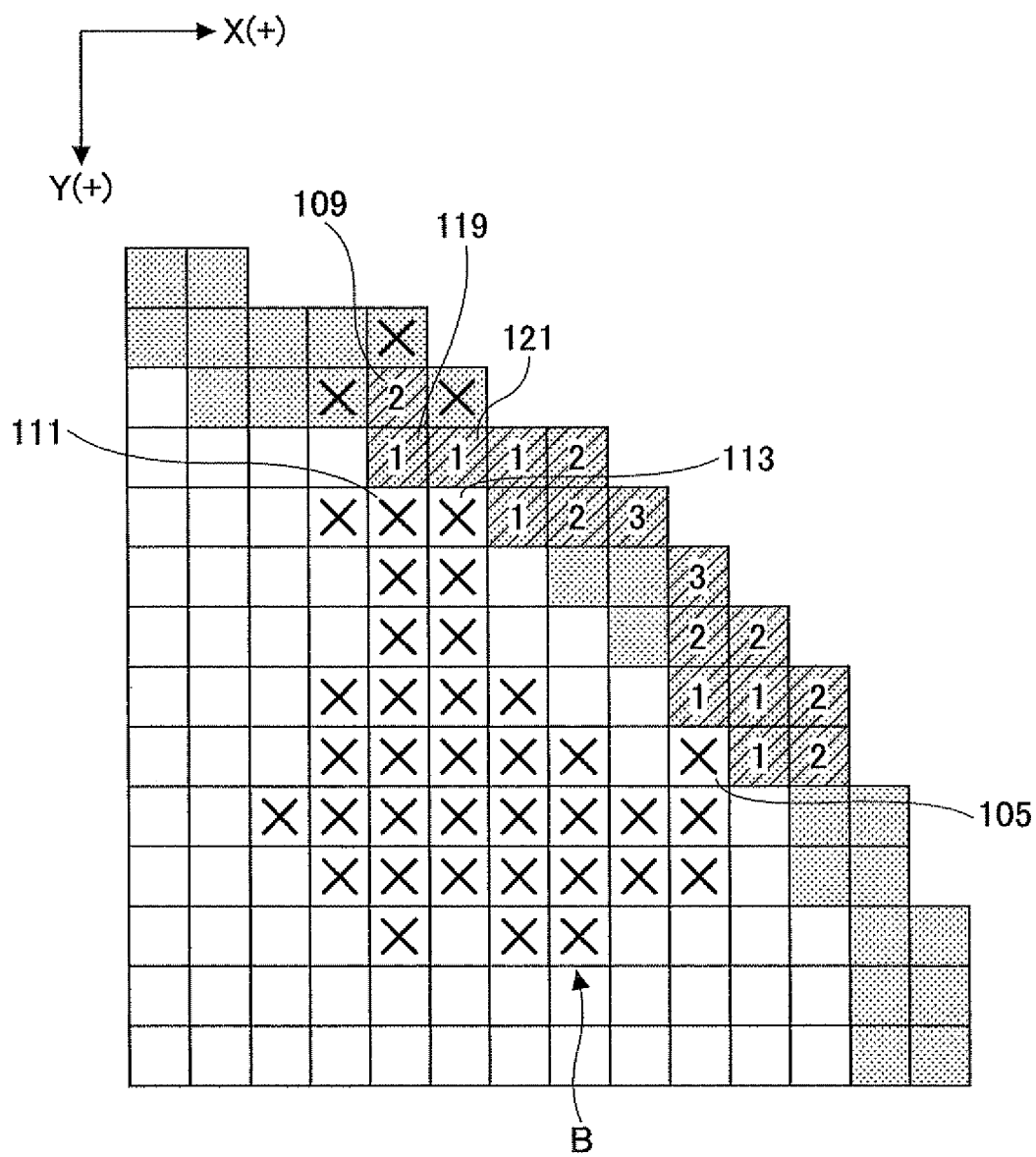
FIG. 13 is an enlarged view of Defective Distribution Concentration B and its neighborhood in the wafer test result illustrated in FIG. 3, showing the quality determination indexes of determination target wafer periphery neighboring chips calculated by yet another method according to the embodiment of the present invention.

FIG. 13 illustrates the result of determining a distance to Defective Distribution Concentration B, that is, the number of chips up to Defective Distribution Concentration B, with respect to each determination target wafer periphery neighboring chip for Defective Distribution Concentration B illustrated in FIG. 3. If the threshold of the first quality determination index is two (within a two-chip range), those determination target wafer periphery neighboring chips indicated by "1" or "2" are determined as additional defective chips. Thus, more determination target wafer periphery neighboring chips are determined as additional defective chips than in the case of using the second quality determination index as well. However, this determination result is smaller in the number of additional defective chips than in the case of determining chips in a two-chip range from a defective distribution concentration as targets of additional inking in order to include the wafer periphery neighboring chip 109 as an additional defective chip in the method disclosed in Japanese Patent No. 3888938.

Figure 14:
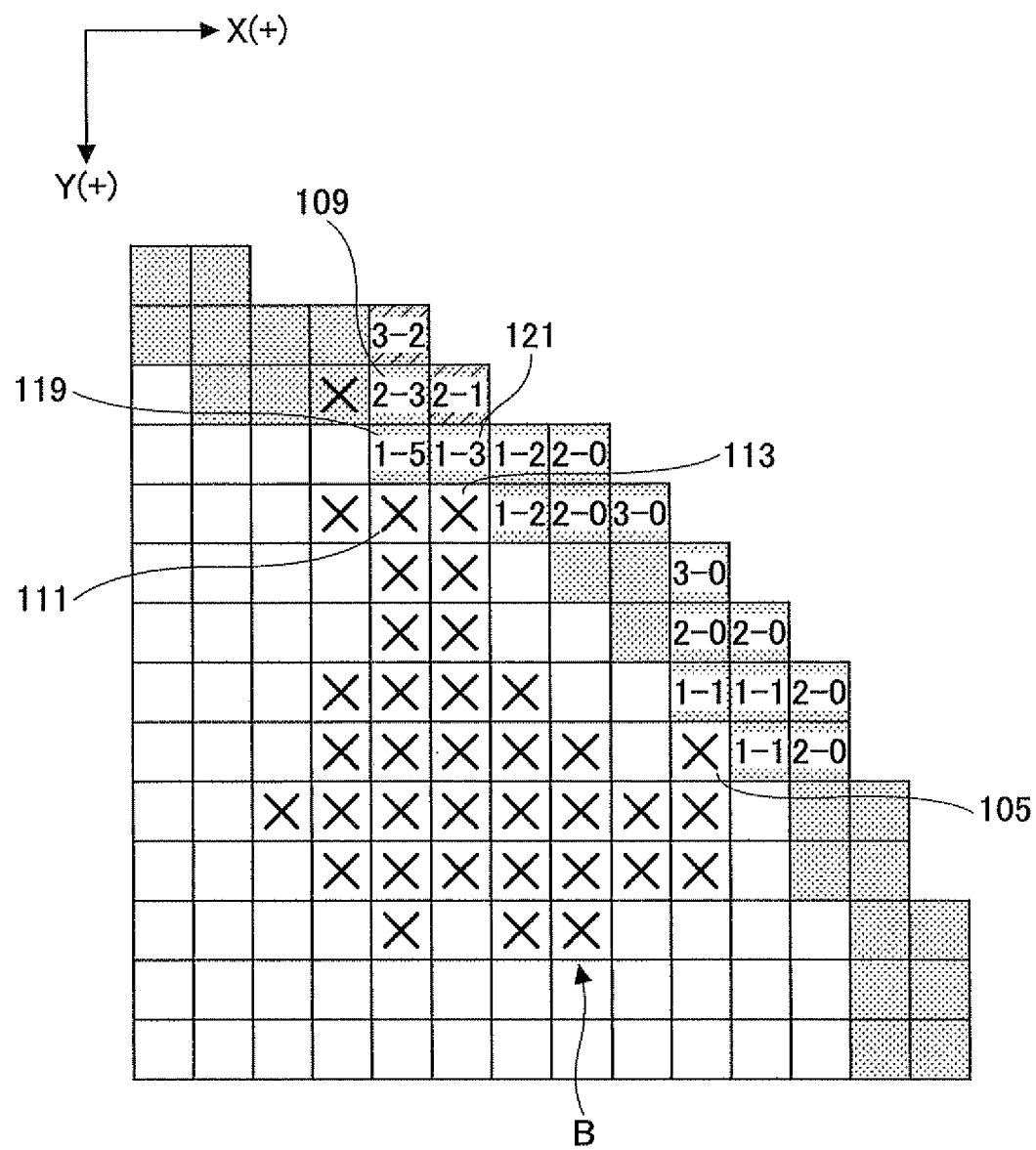
FIG. 14 is an enlarged view of Defective Distribution Concentration B and its neighborhood in the wafer test result illustrated in FIG. 3, showing the quality determination indexes of determination target wafer periphery neighboring chips calculated by yet another method according to the embodiment of the present invention.

Further, in the above-described processing of this embodiment, no quality determination indexes are calculated for a defective chip in the wafer test result that is determined as a determination target wafer periphery neighboring chip. However, the first and/or second quality determination index may also be calculated for such a defective chip the same as for the determination target wafer periphery neighboring chip in step S6. According to this embodiment, an acceptable chip whose quality is difficult to guarantee may be determined as an additional defective chip, but a chip determined defective in the wafer test is not changed to (not determined as) an acceptable chip. Therefore, the chip determined defective in the wafer test remains defective irrespective of the result of quality determination index calculation. FIG. 14 illustrates the result of determining the first and second quality determination indexes of the determination target wafer periphery neighboring chips for Defective Distribution Concentration B illustrated in FIG. 3, where the first and second quality determination indexes are also determined for those determined as defective in the wafer test of the determination target wafer periphery neighboring chips.

Further, in the defective chip grouping step of step S2, defective chips may be grouped (as a defective group) based on the result of an item or a group of items of the wafer test in place of the final or overall result of the wafer test. In this case, the defective chips to be grouped may be limited to those determined as defective with respect to a particular wafer test item or a particular group of wafer test items.

Further, in the quality determination index calculation step of step S6, the second quality determination index may be calculated by treating, as an acceptable chip, a chip determined as defective with respect to a wafer test item other than a particular wafer test item or a particular group of wafer test items.

Further, in the case of limiting defective chips to be grouped to those determined as defective with respect to particular wafer test items or groups of wafer test items, one or both of the thresholds of the first and second quality determination indexes may be determined on an item-by-item or group-by-group basis, that is, may vary from item to item or from group to group in step S7.

Further, also in the case of dividing defective chips into defective groups based on the acceptability of chips in the final wafer test result, of wafer test items or groups of wafer test items for which a chip is determined as defective (defective wafer test items or defective wafer test item groups), that for which the number of chips determined as defective is largest may be determined in each defective group, and the determined defective wafer test item or wafer test item group may be determined as the representative defective wafer test item of the defective group, so that one or both of the thresholds of the first and second quality determination indexes may vary from representative defective wafer test item to representative defective wafer test item.

Empirically, it is known that there is a defective wafer test item that affects wafer periphery neighboring chips, and additional defective chips may be determined more preferably by limiting the number of wafer test items in performing the steps of the processing of this embodiment than by performing the steps of the processing of this embodiment on all defective chips.

Figure 15:
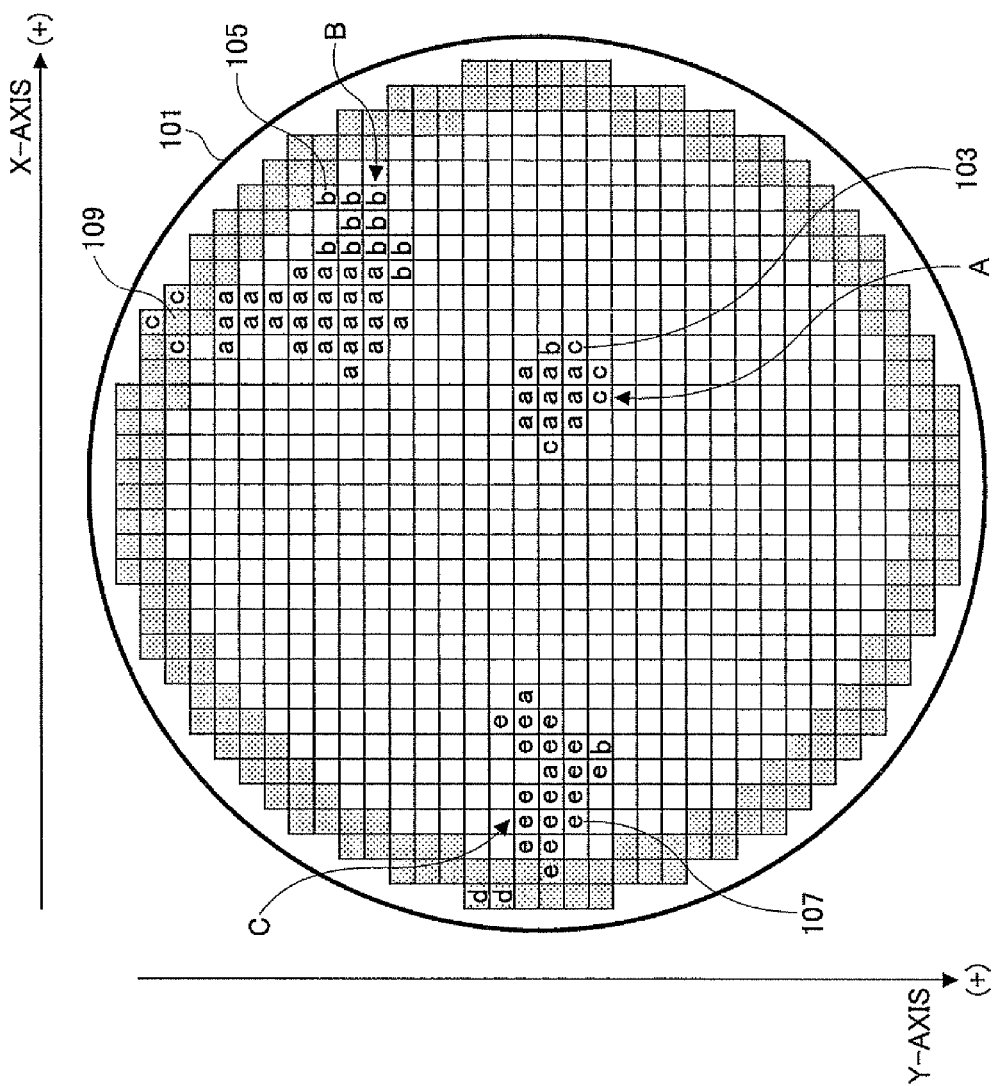
FIG. 15 is a diagram illustrating the wafer test result illustrated in FIG. 3 with defective wafer test items a through e according to the embodiment of the present invention.

FIG. 15 is a diagram illustrating defective wafer test items of defective chips on the wafer 101 of FIG. 3. In FIG. 15, small letters a through e indicate defective wafer test items. A description is given, with reference to FIG. 15, of processing using steps S1 through S7 with respect to defective wafer test items according to this embodiment.

By way of example, it is assumed that the effect of defective wafer test items a, c, and e over wafer periphery neighboring chips is so large as to necessitate determining their quality, and the effect of defective wafer test items b and d over wafer periphery neighboring chips is so small as to obviate the need for determining their quality.

In this case, the target of the grouping of defective chips (into defective groups) in the defective chip grouping step of step S2 may be limited to chips determined as defective for the defective wafer test items a, c, and e.

Further, in calculating the second quality determination index in the quality determination index calculation step of step S6, the target of the calculation of the second quality determination index may be limited to the defective chips of the defective wafer test item a, c, and e.

Further, if the defective wafer test items a, c, and e are different in effect over wafer periphery neighboring chips, one or both of the thresholds of the first and second quality determination indexes may be different in value between the defective wafer test items a, c, and e. In this case, however, the above-described processing of steps S1 through S7 may be performed with respect to each of the defective wafer test items a, c, and e, or the step of determining the representative defective wafer test item as described below may be performed.

First, the defective chip grouping step of step S2 is performed on chips determined as defective in the final wafer test result or chips determined as defective for the defective wafer test items a, c, and e, so that the defective chips are divided into defective groups. In each defective group, a defective wafer test item for which the number of defective chips is largest among the defective wafer test items is identified and determined as the representative defective wafer test item of the defective group. A description is given, with reference to FIG. 15, of an example case.

With respect to Defective Distribution Concentrations A, B, and C, which are defective groups based on chips determined as defective in the final wafer test result and determined as defective distribution concentrations, the number of defective chips is largest for the defective wafer test item a in Defective Distribution Concentrations A and B, and the number of defective chips is largest for the defective wafer test item e in Defective Distribution Concentration C. Therefore, the defective wafer test item a is determined as a representative defective wafer test item in Defective Distribution Concentrations A and B, and the defective wafer test item e is determined as a representative defective wafer test item in Defective Distribution Concentration C.

By thus determining the representative defective wafer test item for each of Defective Distribution Concentrations B and C, it is possible to apply different quality determination index thresholds to Defective Distribution Concentrations B and C.

As described above, no determination target wafer periphery neighboring chips are determined for Defective Distribution Concentration A.

Next, a description is given of systematization using a computer.

Figure 16:
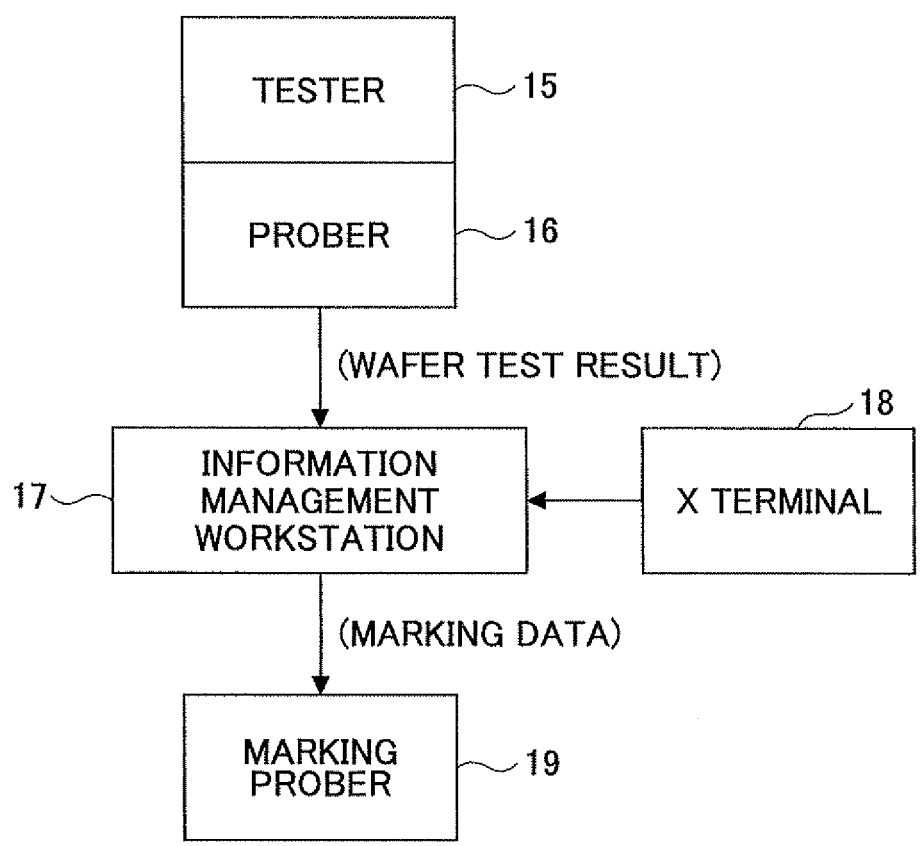
FIG. 16 is a schematic diagram illustrating a quality determination system according to the embodiment of the present invention.

FIG. 16 is a schematic diagram illustrating a quality determination system.

This quality determination system performs inking using a marking prober in place of the inker function of a test prober.

According to this quality determination system, a wafer test is conducted by placing a wafer on a prober 16, and supplying power and providing a test signal with probe needles in contact with the pads of a chip to be tested on the wafer. The result of the wafer test is transmitted from the prober 16 to an information management workstation 17. The wafer test result may be transmitted directly to a marking prober 19. However, since there are usually more than one tester 15, more than one prober 16, and more than one marking prober 19 in the system, it is reasonable to gather wafer test results at the information management workstation 17.

An operator views the wafer test result, and manually performs additional inking determination and creates marking data on the information management workstation 17. This operation may be performed using an X terminal 18. After determining targets of marking, the marking prober 19 is caused to operate on a wafer lot basis. The marking prober 19 reads the marking data from the information management workstation 17, and performs inking on the chips determined as defective in the wafer test result and by the additional inking determination.

Figure 17:
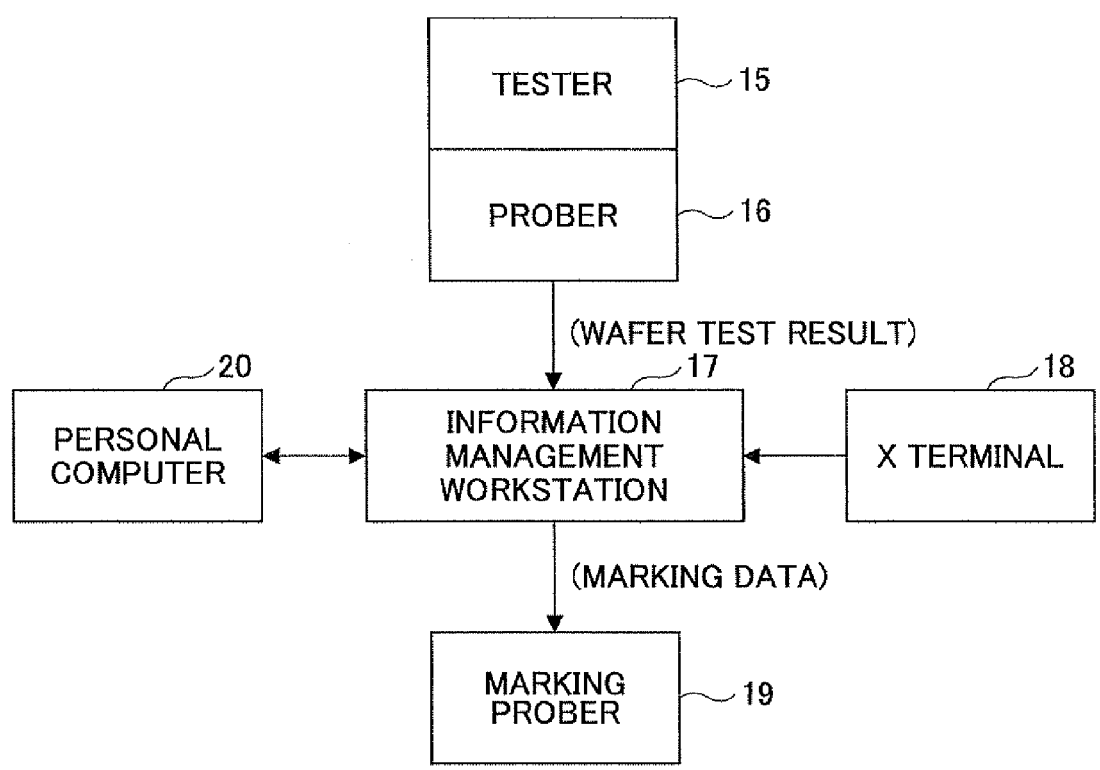
FIG. 17 is a schematic diagram illustrating a quality determination system including a marking mechanism according to the embodiment of the present invention.

FIG. 17 is a schematic diagram illustrating a quality determination system including a marking mechanism according to this embodiment.

A personal computer 20 is connected to the information management workstation 17. Application software including a quality determination program for causing a computer to execute a chip quality determination method according to this embodiment is installed in (a storage medium such as ROM or a hard disk drive (HDD) of) the personal computer 20, but otherwise the configuration is the same as that of the quality determination system illustrated in FIG. 16. The application software may be downloaded via a network such as a LAN or the Internet or from a storage medium such as a CD-ROM through a drive unit. The same as in the quality determination system illustrated in FIG. 16, the wafer test result is transmitted from the prober 16 to the information management workstation 17.

The wafer test results, which include information such as quality information, the coordinate information of chips, acceptability information, and defective item information, are retained in the information management workstation 17. The marking prober 19 may form the marking part of the marking mechanism of this embodiment. The information management workstation 17, a control part that controls the operation of the marking prober 19, and the personal computer 20 may form the control part of the marking mechanism of this embodiment.

Figure 18:
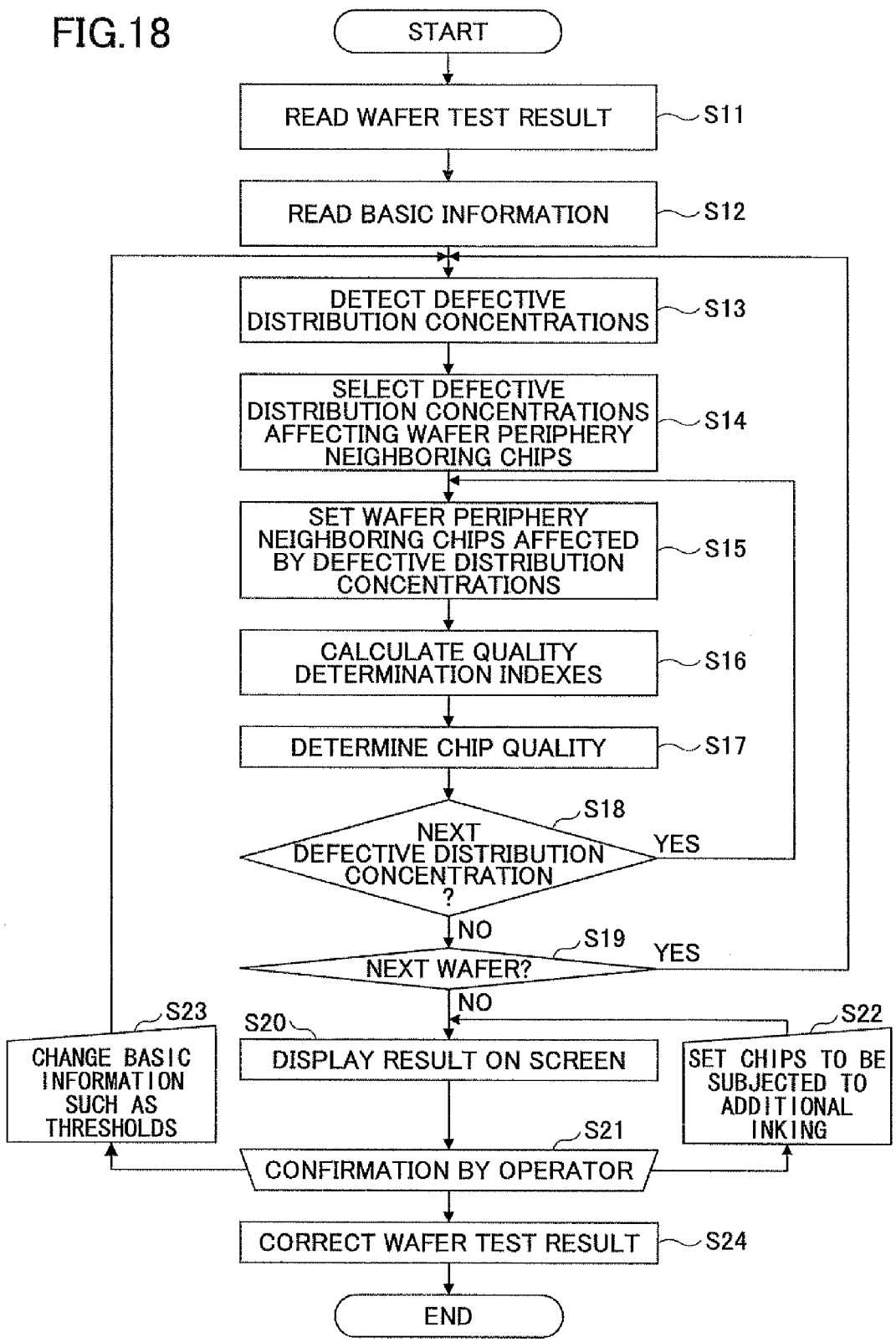
FIG. 18 is a flowchart of application software including a quality determination program according to the embodiment of the present invention.

FIG. 18 is a flowchart of the application software including the quality determination program of this embodiment. This application software displays the automatic determination result of the additional inking chip determination by the above-described algorithm on the screen of the personal computer 20, and further enables an operator to change chips to be subjected to additional inking.

First, in step S11, the program causes the results of a wafer test on a wafer to be read.

In step S12, basic information for data to be processed is read from the wafer test results. The basic information includes information on a chip layout, a method of quality determination, and thresholds used for the determination.

In step S13, defective distribution concentrations on the wafer are detected.

In step S14, one or more defective distribution concentrations that affect wafer periphery neighboring chips are selected from the defective distribution concentrations detected in step S13.

In step S15, with respect to one of the defective distribution concentrations selected in step S14, those of the wafer periphery neighboring chips affected by the one of the defective distribution concentrations are set (determined) as determination target wafer periphery neighboring chips.

In step S16, the quality determination indexes are calculated with respect to the determination target wafer periphery neighboring chips set in step S15.

In step S17, the quality of the determination target wafer periphery neighboring chips is determined by comparing their respective calculated indexes with corresponding thresholds.

In step S18, it is determined whether there is a subsequent defective distribution concentration, that is, whether any of the defective distribution concentrations selected in step S14 is yet to be subjected to the determination target wafer periphery neighboring chip setting (determination) of step S15. If there is a subsequent defective distribution concentration (YES in step S18), the processing returns to step S15, and the processing of steps S15 through S17 is performed on the subsequent defective distribution concentration. If there is no defective distribution concentration (NO in step S18), the processing proceeds to the next wafer determination step of step S19, where it is determined whether there is a wafer that is yet to be subjected to determination (an undetermined wafer).

If it is determined in step S19 that there is an undetermined wafer (YES in step S19), the processing returns to step S13, and the processing of steps S13 through S18 is performed on the undetermined wafer.

If it is determined in step S19 that there is no undetermined wafer (NO in step S19), in step S20, the results are displayed on the screen to be confirmed by the operator. This step may be referred to as a screen display step.

In step S21, the operator checks and confirms the results. In this case, the operator may further add chips (or determine additional chips) to be subjected to additional inking (in step S22), or correct the basic information such as thresholds (in step S23) to return to step S13 for re-determination. The operator may determine a wafer to be subjected to re-determination, or all wafers may be subjected to re-determination.

After confirmation by the operator, in step S24, such correction as to add additional defective chips to the wafer test results is automatically performed based on the chip quality determination result. As a result of correcting the wafer test results, corrected wafer test results formed of the marking data of the entire wafer including the specified additional defective chips or the marking data of the specified additional defective chips are created. The created marking data are transmitted to a tester having a marking mechanism or a marking prober, where inking is performed.

As described above, according to the chip quality determination method of this embodiment, it is possible to determine chip quality while guaranteeing the quality of wafer periphery neighboring chips on a wafer partially including defective chips.

Further, according to the chip quality determination program of this embodiment, it is possible to cause a computer to execute the steps of the chip quality determination method of this embodiment. This eliminates a large number of man-hours conventionally spent in selecting chips that are likely to be defective, and improves the criterion of determination that has depended on the experience of an operator.

Further, introduction of the additional inking system using a marking mechanism according to this embodiment makes it possible to reduce loss due to discarded wafers also in factories where no additional inking has been performed because of the problem of man-hours.

Further, with respect to the system configuration, a personal computer having the program according to this embodiment installed therein may be connected to a tester in such a manner as to enable data exchange as illustrated in FIG. 17, or the tester may have the function of selecting chips to be re-measured by the acceptable chip classification method or the chip quality determination method according to this embodiment.

According to one aspect of the present invention, a chip quality determination method includes the steps of determining the continuity of defective chips in at least four directions of an X-axis and a Y-axis on a wafer based on the wafer test results of determining the acceptability of chips arranged in a matrix in the four directions on the wafer, and dividing the defective chips into one or more defective groups so that successive ones of the defective chips are in the same defective group (a defective chip grouping step); calculating a quality determination index of each of one or more determination target wafer periphery neighboring chips among wafer periphery neighboring chips located within a predetermined range from the periphery of the wafer based on the distance from a corresponding one of the defective groups (a quality determination index calculation step); and determining the quality of the determination target wafer periphery neighboring chips by comparing the quality determination indexes thereof with a preset threshold (a quality determination step).

Here, the predetermined range from the periphery of the wafer for defining the wafer periphery neighboring chips may be a range within a certain distance from the periphery of the wafer or a range correlated in advance with layout information as chip information. In the latter case, for example, with respect to the predetermined range from the periphery of the wafer for defining the wafer periphery neighboring chips, the distance from the periphery of the wafer may differ between the orientation flat part and other parts of the wafer.

Further, in the present invention, the four directions of the X-axis and the Y-axis mean the plus (+) and minus (−) directions of the X-axis and the plus (+) and minus (−) directions of the Y-axis.

Further, the determination target wafer periphery neighboring chips may be all or some of the wafer periphery neighboring chips on the wafer.

Further, the wafer test results include not only a final wafer test result but also the wafer test results of wafer test items and the wafer test result of a group of wafer test times (wafer test item group). Here, according to the wafer test results of a group of wafer test items, a chip determined as defective with respect to any of the wafer test items included in the group is determined as a defective chip, and a chip determined as acceptable (non-defective) with respect to all of the wafer test items included in the group is determined as acceptable (non-defective).

Here, if the defective chips are divided into defective groups based on their continuity in the defective chip grouping step, the detected defective groups vary in size from small defective groups to large defective groups. The degradation of the quality of small defective groups has a limited effect over their neighboring chips. Accordingly, it is less important to calculate the quality determination indexes of determination target wafer periphery neighboring chips for small defective groups in the quality determination index calculation step.

Therefore, the chip quality determination method may further include the step of comparing, with respect to each of the defective groups, the number of defective chips thereof with a preset threshold and determining the defective group as a defective distribution concentration in response to the number of defective chips being more than or equal to the threshold (a defective distribution concentration determination step), wherein the quality determination index calculation step may calculate the quality determination index of each of the determination target wafer periphery neighboring chips with respect to one or more of the defective groups determined as the defective distribution concentration in the defective distribution concentration determination step. In this case, the quality determination index calculation step may calculate the quality determination index of each of the determination target wafer periphery neighboring chips with respect to only one or more of the defective groups determined as the defective distribution concentration in the defective distribution concentration determination step.

Further, if the defective groups detected in the defective chip grouping step are remote from the periphery of the wafer, the effect of the quality degradation of the defective groups over the wafer periphery neighboring chips is limited.

Accordingly, the chip quality determination method may further include the step of selecting one or more of the defective groups whose quality degradation is likely to affect the wafer periphery neighboring chips from the detected defective groups (a defective group selection step), wherein the quality determination index calculation step may calculate the quality determination index of each of the determination target wafer periphery neighboring chips with respect to the one or more of the defective groups selected in the defective group selection step. In this case, the quality determination index calculation step may calculate the quality determination index of each of the determination target wafer periphery neighboring chips with respect to only the one or more of the defective groups selected in the defective group selection step.

Examples of the defective group selection step may include selecting one or more of the defective groups having at least one of the defective chips thereof in contact with at least one of the wafer periphery neighboring chips.

Examples of the defective group selection step may also include selecting one or more of the defective groups having at least one of the defective chips thereof located within the predetermined range from the periphery of the wafer.

In the configuration including the defective group selection step, the chip quality determination method may further include the step of comparing, with respect to each of the defective groups, the number of defective chips thereof with a preset threshold and determining the defective group as a defective distribution concentration in response to the number of defective chips being more than or equal to the threshold (a defective distribution concentration determination step), wherein the quality determination index calculation step may calculate the quality determination index of each of the determination target wafer periphery neighboring chips with respect to one or more of the defective groups determined as the defective distribution concentration in the defective distribution concentration determination step and selected in the defective group selection step. In this case, the quality determination index calculation step may calculate the quality determination index of each of the determination target wafer periphery neighboring chips with respect to only one or more of the defective groups determined as the defective distribution concentration in the defective distribution concentration determination step and selected in the defective group selection step.

Here, the defective group selection step and the defective distribution concentration determination step may be performed in any order. Further, in the case of performing both steps, at the time of performing one of the steps after performing the other one of the steps, the one of the steps may be performed only on the defective groups selected or determined in the other one of the steps.

According to this chip quality determination method, the quality determination index may be calculated with respect to each of the wafer periphery neighboring chips on the wafer by determining them as determination target wafer periphery neighboring chips. However, it is more efficient in information processing to determine chip quality by setting, as targets of determination, wafer periphery neighboring chips that may be affected by the quality degradation of the defective groups.

Accordingly, the chip quality determination method may further include the step of setting, as the determination target wafer periphery neighboring chips, one or more of the wafer periphery neighboring chips that may be affected by the quality degradation of the defective groups (a determination target setting step), the quality determination index calculation step may calculate the quality determination index of each of the determination target wafer periphery neighboring chips set in the determination target setting step. In this case, the quality determination index calculation step may calculate the quality determination indexes of only the determination target wafer periphery neighboring chips set in the determination target setting step.

Examples of the determination target setting step may include setting, as the determination target wafer periphery neighboring chips, a first one or more of the wafer periphery neighboring chips positioned in a first direction from a first one of the defective chips, the first one of the defective chips being not included in the wafer periphery neighboring chips and being in contact with one of the wafer periphery neighboring chips in the first direction; a second one or more of the wafer periphery neighboring chips in each of a second direction and a third direction from a second one of the defective chips in each of which directions the second one of the defective chips is in contact with one of the wafer periphery neighboring chips; and a third one or more of the wafer periphery neighboring chips located between the second and third directions relative to the second one of the defective chips, the second one of the defective chips being not included in the wafer periphery neighboring chips, the second and third directions being along the X-axis and the Y-axis, respectively.

Examples of the determination target setting step may also include setting, as the determination target wafer periphery neighboring chips, a first one or more of the wafer periphery neighboring chips in at least one of a first direction and a second direction from one of the defective chips and a second one or more of the wafer periphery neighboring chips in a third direction inclined at 45 degrees to one of the first and second directions, the one of the defective chips being not included in the wafer periphery neighboring chips and in contact therewith in the at least one of the first and second directions, the first and second directions being along the X-axis and the Y-axis, respectively.

Examples of the determination target setting step may further include setting, as the determination target wafer periphery neighboring chips, one or more of the wafer periphery neighboring chips located within a predetermined range from one of the defective chips.

In the configuration including the determination target setting step, the chip quality determination method may further include the step of comparing, with respect to each of the defective groups, a number of defective chips thereof with a preset threshold and determining the defective group as a defective distribution concentration in response to the number of defective chips being more than or equal to the threshold (a defective distribution concentration determination step), wherein the determination target setting step may set the determination target wafer periphery neighboring chips for one or more of the defective groups determined as the defective distribution concentration in the defective distribution concentration determination step, and the quality determination index calculation step may calculate the quality determination index of each of the determination target wafer periphery neighboring chips with respect to the one or more of the defective groups determined as the defective distribution concentration in the defective distribution concentration determination step. In this case, the determination target setting step may set the determination target wafer periphery neighboring chips for only one or more of the defective groups determined as the defective distribution concentration in the defective distribution concentration determination step, and the quality determination index calculation step may calculate the quality determination index of each of the determination target wafer periphery neighboring chips with respect to only the one or more of the defective groups determined as the defective distribution concentration in the defective distribution concentration determination step.

Further, in the configuration including the determination target setting step, the chip quality determination method may further include the step of selecting one or more of the defective groups whose quality degradation is likely to affect the wafer periphery neighboring chips from the detected defective groups (a defective group selection step), wherein the determination target setting step may set the determination target wafer periphery neighboring chips for the one or more of the defective groups selected in the defective group selection step, and the quality determination index calculation step may calculate the quality determination index of each of the determination target wafer periphery neighboring chips with respect to the one or more of the defective groups selected in the defective group selection step. In this case, the determination target setting step may set the determination target wafer periphery neighboring chips for only the one or more of the defective groups selected in the defective group selection step, and the quality determination index calculation step may calculate the quality determination index of each of the determination target wafer periphery neighboring chips with respect to only the one or more of the defective groups selected in the defective group selection step.

Examples of the defective group selection step may include selecting one or more of the defective groups having at least one of the defective chips thereof in contact with at least one of the wafer periphery neighboring chips.

Examples of the defective group selection step may also include selecting one or more of the defective groups having at least one of the defective chips thereof located within the predetermined range from the periphery of the wafer.

Further, in the configuration including the determination target setting step and the defective group selection step, the chip quality determination method may further include the step of comparing, with respect to each of the defective groups, a number of defective chips thereof with a preset threshold and determining the defective group as a defective distribution concentration in response to the number of defective chips being more than or equal to the threshold (a defective distribution concentration determination step), wherein the determination target setting step may set the determination target wafer periphery neighboring chips for one or more of the defective groups determined as the defective distribution concentration in the defective distribution concentration determination step and selected in the defective group selection step, and the quality determination index calculation step may calculate the quality determination index of each of the determination target wafer periphery neighboring chips with respect to the one or more of the defective groups determined as the defective distribution concentration in the defective distribution concentration determination step and selected in the defective group selection step. In this case, the determination target setting step may set the determination target wafer periphery neighboring chips for only one or more of the defective groups determined as the defective distribution concentration in the defective distribution concentration determination step and selected in the defective group selection step, and the quality determination index calculation step may calculate the quality determination index of each of the determination target wafer periphery neighboring chips with respect to only the one or more of the defective groups determined as the defective distribution concentration in the defective distribution concentration determination step and selected in the defective group selection step.

According to the chip quality determination method, the chip continuity on coordinates may be in the four directions following the X-axis and Y-axis. However, the chip continuity on coordinates may be in eight directions, that is, the four directions and another four directions inclined at 45 degrees to the four directions.

The chip quality determination method may further include the step of calculating an additional quality determination index of each of the determination target wafer periphery neighboring chips based on a number of defective chips within a predetermined range from the determination target wafer periphery neighboring chip (an additional chip quality determination index calculation step), wherein the quality determination step may determine the quality of the determination target wafer periphery neighboring chips by comparing the quality determination index thereof with the preset threshold and comparing the additional quality determination index with a preset additional threshold.

Further, according to the chip quality determination method, the wafer test result may include the wafer test results of wafer test items or the wafer test result of a group of wafer test items.

Generally, in the case of the same abnormality in the same manufacturing process, chips tend to be determined as defective with respect to the same test item in most cases. Therefore, in the chip quality determination method, the accuracy of determination may be improved by make determination on a wafer test item basis. However, it takes too much time to perform processing on a test item basis. Further, in the case where there are multiple test items, when a chip is determined as defective with respect to one of the test items, the chip is no longer tested with respect to the subsequent test items in order to shorten time for the wafer test. Therefore, the test items may be grouped, and the chip quality determination method may use the test results of the respective test item groups. The test items may be grouped with item redundancy. The item redundancy may reduce the problem caused by not being tested with respect to the subsequent items when determined as defective.

According to one aspect of the present invention, a computer-readable storage medium storing a chip quality determination program is for causing a computer to execute the steps of the chip quality determination method.

According to one aspect of the present invention, a marking mechanism includes a marking part configured to mark a position on a wafer; and a control part configured to control an operation of the marking part, the control part including a program for causing a computer to execute the chip quality determination method as set forth above, the control part being configured to cause the marking part to operate so as to mark the position on the wafer, the position corresponding to a chip determined as defective by the program.

According to one aspect of the present invention, with respect to the wafer periphery neighboring chips on a wafer where multiple chips are arranged in a matrix in the X-axis and Y-axis directions, it is possible to determine their quality with accuracy while guaranteeing their quality using a unique index.

According to one aspect of the present invention, it is possible to eliminate processing for small defective groups that have little or limited effect over the quality of their surrounding chips in the quality determination index calculation step. This makes it possible to simplify the chip quality determination process, and to improve processing rate at the time of causing a computer to perform this process.

According to one aspect of the present invention, it is possible to eliminate processing for defective groups that do not affect the quality of the wafer periphery neighboring chips in the quality determination index calculation step. This makes it possible to simplify the chip quality determination process, and to improve the processing rate at the time of causing a computer to perform this process.

According to one aspect of the present invention, it is possible to eliminate processing for defective groups that do not affect the quality of the wafer periphery neighboring chips and small defective groups in the quality determination index calculation step. This makes it possible to further simplify the chip quality determination process, and to further improve the processing rate at the time of causing a computer to perform this process. Here, the defective group selection step and the defective distribution concentration determination step may be performed in any order. In the case of performing both steps, at the time of performing one of the steps after performing the other one of the steps, the one of the steps may be performed only on the defective groups selected or determined in the other one of the steps. This makes it possible to further simplify the chip quality determination process, and to further improve the processing rate at the time of causing a computer to perform this process.

According to one aspect of the present invention, compared with the case of determining all wafer periphery neighboring chips as targets of determination, it possible to simplify the chip quality determination process, and to improve the processing rate at the time of causing a computer to perform this process.

According to one aspect of the present invention, the chip continuity on coordinates may be in the four directions following the X-axis and the Y-axis. This may prevent a defective group from being detected as greater in size than necessary in the defective chip grouping step. For some lots, however, it is preferable that the chip continuity on coordinates be in eight directions, that is, the four directions and another four directions inclined at 45 degrees to the four directions.

According to one aspect of the present invention, it is possible to improve the accuracy of quality determination.

For some lots, however, it is preferable to perform the chip quality determination using only the quality determination index without using the additional quality determination index.

According to one aspect of the present invention, it is possible to perform the chip quality determination method using a computer. This eliminates a large number of man-hours conventionally spent in selecting chips that are likely to be defective, and improves the criterion of determination that has depended on the experience of an operator.

According to one aspect of the present invention, inputting determination conditions such as determination chip indexes and thresholds in advance makes it possible to determine the quality of chips while guaranteeing their quality on a wafer partially including defective chips, and to automatically mark chips determined as defective chips.

The present invention is not limited to the specifically disclosed embodiment, and variations and modifications may be made without departing from the scope of the present invention.

The present application is based on Japanese Priority Patent Application No. 2008-188687, filed on Jul. 22, 2008, the entire contents of which are incorporated herein by reference.

The invention claimed is:

1. A chip quality determination method, comprising the steps of:
   (a) determining a continuity of defective chips in at least four directions of an X-axis and a Y-axis on a wafer based on a wafer test result of determining acceptability of chips arranged in a matrix in the four directions on the wafer, and dividing the defective chips into one or more defective groups so that successive ones of the defective chips are in a same defective group;
   (b) calculating a quality determination index of each of one or more determination target wafer periphery neighboring chips among wafer periphery neighboring chips located within a predetermined range from a periphery of the wafer based on a distance from a corresponding one of the defective groups; and
   (c) determining a quality of the determination target wafer periphery neighboring chips by comparing the quality determination indexes thereof with a preset threshold.

2. The chip quality determination method as claimed in claim 1, further comprising the step of:
   (d) comparing, with respect to each of the defective groups, a number of defective chips thereof with a preset threshold and determining the defective group to be a defective distribution concentration in response to the number of defective chips being more than or equal to the threshold,
   wherein said step (b) calculates the quality determination index of each of the determination target wafer periphery neighboring chips with respect to one or more of the defective groups determined to be the defective distribution concentration in said step (d).

3. The chip quality determination method as claimed in claim 1, further comprising the step of:
   (d) selecting one or more of the defective groups having at least one of the defective chips thereof in contact with at least one of the wafer periphery neighboring chips,
   wherein said step (b) calculates the quality determination index of each of the determination target wafer periphery neighboring chips with respect to the one or more of the defective groups selected in said step (d).

4. The chip quality determination method as claimed in claim 3, further comprising the step of:

(e) comparing, with respect to each of the defective groups, a number of defective chips thereof with a preset threshold and determining the defective group to be a defective distribution concentration in response to the number of defective chips being more than or equal to the threshold, wherein said step (b) calculates the quality determination index of each of the determination target wafer periphery neighboring chips with respect to one or more of the defective groups determined to be the defective distribution concentration in said step (e) and selected in said step (d).

5. The chip quality determination method as claimed in claim 1, further comprising the step of:

(d) selecting one or more of the defective groups having at least one of the defective chips thereof located within the predetermined range from the periphery of the wafer, wherein said step (b) calculates the quality determination index of each of the determination target wafer periphery neighboring chips with respect to the one or more of the defective groups selected in said step (d).

6. The chip quality determination method as claimed in claim 5, further comprising the step of:

(e) comparing, with respect to each of the defective groups, a number of defective chips thereof with a preset threshold and determining the defective group to be a defective distribution concentration in response to the number of defective chips being more than or equal to the threshold, wherein said step (b) calculates the quality determination index of each of the determination target wafer periphery neighboring chips with respect to one or more of the defective groups determined to be the defective distribution concentration in said step (e) and selected in said step (d).

7. The chip quality determination method as claimed in claim 1, further comprising the step of:

(d) setting, as the determination target wafer periphery neighboring chips, a first one or more of the wafer periphery neighboring chips positioned in a first direction from a first one of the defective chips, the first one of the defective chips being not included in the wafer periphery neighboring chips and being in contact with one of the wafer periphery neighboring chips in the first direction; a second one or more of the wafer periphery neighboring chips in each of a second direction and a third direction from a second one of the defective chips in each of which directions the second one of the defective chips is in contact with one of the wafer periphery neighboring chips; and a third one or more of the wafer periphery neighboring chips located between the second and third directions relative to the second one of the defective chips, the second one of the defective chips being not included in the wafer periphery neighboring chips, the second and third directions being along the X-axis and the Y-axis, respectively, wherein said step (b) calculates the quality determination index of each of the determination target wafer periphery neighboring chips set in said step (d).

8. The chip quality determination method as claimed in claim 7, further comprising the step of:

(e) comparing, with respect to each of the defective groups, a number of defective chips thereof with a preset threshold and determining the defective group to be a defective distribution concentration in response to the number of defective chips being more than or equal to the threshold, wherein said step (d) sets the determination target wafer periphery neighboring chips for one or more of the defective groups determined to be the defective distribution concentration in said step (e), and said step (b) calculates the quality determination index of each of the determination target wafer periphery neighboring chips with respect to the one or more of the defective groups determined to be the defective distribution concentration in said step (e).

9. The chip quality determination method as claimed in claim 7, further comprising the step of:

(e) selecting one or more of the defective groups having at least one of the defective chips thereof in contact with at least one of the wafer periphery neighboring chips, wherein said step (d) sets the determination target wafer periphery neighboring chips for the one or more of the defective groups selected in said step (e), and said step (b) calculates the quality determination index of each of the determination target wafer periphery neighboring chips with respect to the one or more of the defective groups selected in said step (e).

10. The chip quality determination method as claimed in claim 9, further comprising the step of:

(f) comparing, with respect to each of the defective groups, a number of defective chips thereof with a preset threshold and determining the defective group to be a defective distribution concentration in response to the number of defective chips being more than or equal to the threshold, wherein said step (d) sets the determination target wafer periphery neighboring chips for one or more of the defective groups determined to be the defective distribution concentration in said step (f) and selected in step (e), and said step (b) calculates the quality determination index of each of the determination target wafer periphery neighboring chips with respect to the one or more of the defective groups determined as the defective distribution concentration in said step (f) and selected in step (e).

11. The chip quality determination method as claimed in claim 7, further comprising the step of:

(e) selecting one or more of the defective groups having at least one of the defective chips thereof located within the predetermined range from the periphery of the wafer, wherein said step (d) sets the determination target wafer periphery neighboring chips for the one or more of the defective groups selected in said step (e), and said step (b) calculates the quality determination index of each of the determination target wafer periphery neighboring chips with respect to the one or more of the defective groups selected in said step (e).

12. The chip quality determination method as claimed in claim 11, further comprising the step of:

(f) comparing, with respect to each of the defective groups, a number of defective chips thereof with a preset threshold and determining the defective group to be a defective distribution concentration in response to the number of defective chips being more than or equal to the threshold, wherein said step (d) sets the determination target wafer periphery neighboring chips for one or more of the defective groups determined to be the defective distribution concentration in said step (f) and selected in step (e), and said step (b) calculates the quality determination index of each of the determination target wafer periphery neighboring chips with respect to the one or more of the defective groups determined to be the defective distribution concentration in said step (f) and selected in step (e).

13. The chip quality determination method as claimed in claim 1, further comprising the step of:
(d) setting, as the determination target wafer periphery neighboring chips, a first one or more of the wafer periphery neighboring chips in at least one of a first direction and a second direction from one of the defective chips and a second one or more of the wafer periphery neighboring chips in a third direction inclined at 45 degrees to one of the first and second directions, the one of the defective chips being not included in the wafer periphery neighboring chips and in contact therewith in the at least one of the first and second directions, the first and second directions being along the X-axis and the Y-axis, respectively,
wherein said step (b) calculates the quality determination index of each of the determination target wafer periphery neighboring chips set in said step (d).

14. The chip quality determination method as claimed in claim 13, further comprising the step of:
(e) comparing, with respect to each of the defective groups, a number of defective chips thereof with a preset threshold and determining the defective group to be a defective distribution concentration in response to the number of defective chips being more than or equal to the threshold,
wherein said step (d) sets the determination target wafer periphery neighboring chips for one or more of the defective groups determined to be the defective distribution concentration in said step (e), and
said step (b) calculates the quality determination index of each of the determination target wafer periphery neighboring chips with respect to the one or more of the defective groups determined to be the defective distribution concentration in said step (e).

15. The chip quality determination method as claimed in claim 13, further comprising the step of:
(e) selecting one or more of the defective groups having at least one of the defective chips thereof in contact with at least one of the wafer periphery neighboring chips,
wherein said step (d) sets the determination target wafer periphery neighboring chips for the one or more of the defective groups selected in said step (e), and
said step (b) calculates the quality determination index of each of the determination target wafer periphery neighboring chips with respect to the one or more of the defective groups selected in said step (e).

16. The chip quality determination method as claimed in claim 13, thither comprising the step of:
(e) selecting one or more of the defective groups having at least one of the defective chips thereof located within the predetermined range from the periphery of the wafer,
wherein said step (d) sets the determination target wafer periphery neighboring chips for the one or more of the defective groups selected in said step (e), and said step (b) calculates the quality determination index of each of the determination target wafer periphery neighboring chips with respect to the one or more of the defective groups selected in said step (e).

17. The chip quality determination method as claimed in claim 1, further comprising the step of:
(d) setting, as the determination target wafer periphery neighboring chips, one or more of the wafer periphery neighboring chips located within a predetermined range from one of the defective chips,
wherein said step (b) calculates the quality determination index of each of the determination target wafer periphery neighboring chips set in said step (d).

18. The chip quality determination method as claimed in claim 17, further comprising the step of:
(e) comparing, with respect to each of the defective groups, a number of defective chips thereof with a preset threshold and determining the defective group to be a defective distribution concentration in response to the number of defective chips being more than or equal to the threshold,
wherein said step (d) sets the determination target wafer periphery neighboring chips for one or more of the defective groups determined to be the defective distribution concentration in said step (e), and
said step (b) calculates the quality determination index of each of the determination target wafer periphery neighboring chips with respect to the one or more of the defective groups determined to be the defective distribution concentration in said step (e).

19. The chip quality determination method as claimed in claim 17, further comprising the step of:
(e) selecting one or more of the defective groups having at least one of the defective chips thereof in contact with at least one of the wafer periphery neighboring chips,
wherein said step (d) sets the determination target wafer periphery neighboring chips for the one or more of the defective groups selected in said step (e), and
said step (b) calculates the quality determination index of each of the determination target wafer periphery neighboring chips with respect to the one or more of the defective groups selected in said step (e).

20. The chip quality determination method as claimed in claim 17, further comprising the step of:
(e) selecting one or more of the defective groups having at least one of the defective chips thereof located within the predetermined range from the periphery of the wafer,
wherein said step (d) sets the determination target wafer periphery neighboring chips for the one or more of the defective groups selected in said step (e), and
said step (b) calculates the quality determination index of each of the determination target wafer periphery neighboring chips with respect to the one or more of the defective groups selected in said step (e).

* * * * *